US009460944B2

(12) United States Patent
Fujiwara et al.

(10) Patent No.: US 9,460,944 B2
(45) Date of Patent: Oct. 4, 2016

(54) SUBSTRATE TREATING APPARATUS AND METHOD OF TREATING SUBSTRATE

(71) Applicant: SCREEN Holdings Co., Ltd., Kyoto (JP)

(72) Inventors: Naozumi Fujiwara, Kyoto (JP); Toru Edo, Kyoto (JP); Jun Sawashima, Kyoto (JP); Tatsumi Shimomura, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/746,950

(22) Filed: Jun. 23, 2015

(65) Prior Publication Data

US 2016/0005630 A1 Jan. 7, 2016

(30) Foreign Application Priority Data

| Jul. 2, 2014 | (JP) | 2014-136496 |
| Jul. 2, 2014 | (JP) | 2014-136497 |
| Jul. 8, 2014 | (JP) | 2014-140194 |

(51) Int. Cl.
*H01L 21/67* (2006.01)
*H01L 21/02* (2006.01)
(Continued)

(52) U.S. Cl.
CPC ..... *H01L 21/6708* (2013.01); *H01L 21/02019* (2013.01); *H01L 21/02057* (2013.01); *H01L 21/67051* (2013.01); *H01L 21/67109* (2013.01); *H01L 21/67248* (2013.01); *H01L 21/67253* (2013.01); *H01L 22/26* (2013.01)

(58) Field of Classification Search
CPC .................. H01L 21/6708; H01L 21/68714

USPC ............................................. 438/748; 134/26
See application file for complete search history.

(56) References Cited

U.S. PATENT DOCUMENTS

| 8,398,817 B2 | 3/2013 | Namba et al. ............ 156/345.55 |
| 2008/0230101 A1* | 9/2008 | Hayashi .................... B08B 3/08 |
| | | 134/57 R |

(Continued)

FOREIGN PATENT DOCUMENTS

| JP | 2008-130951 | 6/2008 |
| JP | 2010-080583 | 4/2010 |

(Continued)

OTHER PUBLICATIONS

Jun. 20, 2016 Office Action in corresponding Taiwanese application, with partial English translation.

*Primary Examiner* — Moazzam Hossain
(74) *Attorney, Agent, or Firm* — Ostrolenk Faber LLP

(57) ABSTRACT

A substrate treating apparatus includes a rotating and holding unit that rotates a substrate, a first supply source that supplies first pure water having a first temperature, a second supply source that supplies second pure water having a second temperature higher than the first temperature, a treatment solution supply unit that supplies a treatment solution to a central section of an upper surface of the substrate, a first supply unit that supplies a first liquid containing the first pure water to a central section of a lower surface of the substrate, a second supply unit that supplies a second liquid containing the second pure water to a peripheral section and an intermediate section of the lower surface, and a heat amount control unit that independently controls an amount of heat to be supplied by the first supply unit and an amount of heat to be supplied by the second supply unit.

13 Claims, 15 Drawing Sheets

(51) Int. Cl.
*H01L 21/324* (2006.01)
*H01L 21/66* (2006.01)

(56) References Cited

U.S. PATENT DOCUMENTS

| | | | |
|---|---|---|---|
| 2009/0056765 A1* | 3/2009 | Choi | H01L 21/67051 134/33 |
| 2011/0089137 A1* | 4/2011 | Tanaka | H01L 21/67051 216/13 |
| 2012/0160278 A1* | 6/2012 | Higashijima | H01L 21/67051 134/33 |
| 2012/0164840 A1* | 6/2012 | Tanaka | H01L 21/67051 438/745 |
| 2014/0060423 A1 | 3/2014 | Nakai et al. | |
| 2015/0075571 A1 | 3/2015 | Miura | |

FOREIGN PATENT DOCUMENTS

| | | |
|---|---|---|
| JP | 2011-075346 | 4/2011 |
| JP | 2012-151439 | 8/2012 |
| JP | 5123122 | 1/2013 |
| TW | 201351534 | 12/2013 |
| TW | 201420201 | 6/2014 |

\* cited by examiner

F I G. 7
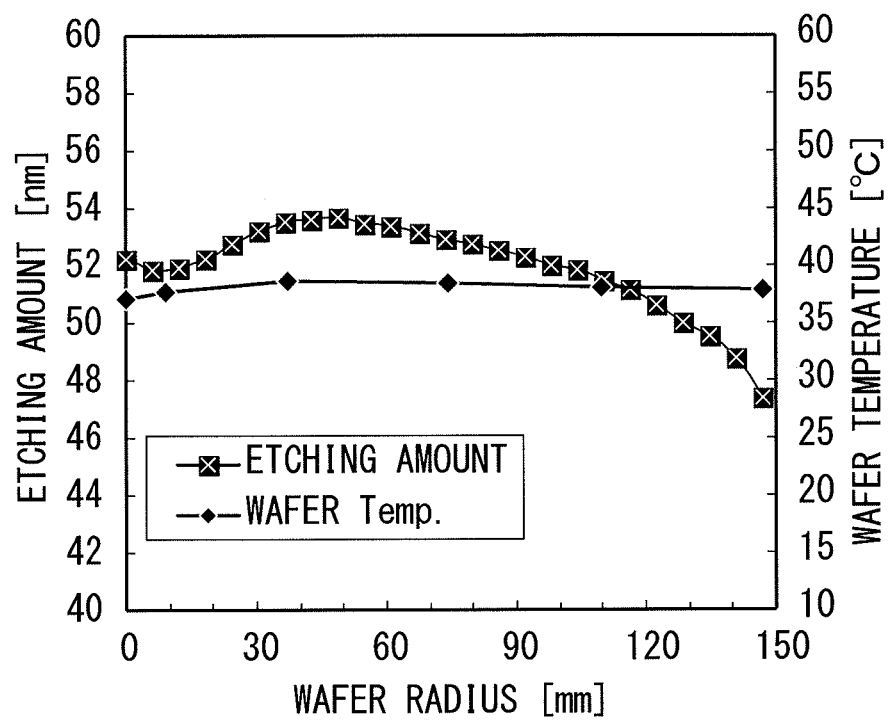

FIG. 15

| NONE | PLACE | | | | | | |
|---|---|---|---|---|---|---|---|
| | A | B | C | D | E | F | G |
| RESULT 1 | OK | OK | OK | NG | NG | OK | OK |
| RESULT 2 | OK | OK | OK | NG | NG | OK | OK |
| RESULT 3 | OK | OK | OK | NG | NG | OK | OK |

FIG. 16

| 400 ml/min | PLACE | | | | | | |
|---|---|---|---|---|---|---|---|
| | A | B | C | D | E | F | G |
| RESULT 1 | OK | OK | OK | NG | NG | OK | OK |
| RESULT 2 | OK | OK | OK | NG | NG | OK | OK |
| RESULT 3 | OK | OK | OK | NG | NG | OK | OK |

FIG. 17

| 800 ml/min | PLACE | | | | | | |
|---|---|---|---|---|---|---|---|
| | A | B | C | D | E | F | G |
| RESULT 1 | OK | OK | OK | OK | NG | OK | OK |
| RESULT 2 | OK | OK | OK | OK | NG | OK | OK |
| RESULT 3 | OK | OK | OK | OK | NG | OK | OK |

FIG. 18

| 1200 ml/min | PLACE | | | | | | |
|---|---|---|---|---|---|---|---|
| | A | B | C | D | E | F | G |
| RESULT1 | OK | OK | OK | OK | OK | OK | OK |
| RESULT2 | OK | OK | OK | OK | OK | OK | OK |
| RESULT3 | OK | OK | OK | OK | OK | OK | OK |

SUBSTRATE TREATING APPARATUS AND METHOD OF TREATING SUBSTRATE

BACKGROUND OF THE INVENTION

1. Field of the Invention

The present invention relates to a substrate treatment technique of treating a substrate by supplying a substrate with a treatment solution while rotating the substrate.

2. Description of Background Art

As such a substrate treatment technique, Japanese Patent No. 5123122 discloses a substrate treating apparatus that supplies a fluid, preliminarily subjected to temperature control, to a large number of points between the central portion and the edge portion of the substrate and emits a treatment solution to the upper surface of the substrate, thereby treating the substrate. The apparatus includes temperature control units individually controlling the temperatures of the fluids supplied from a large number of points below the substrate. Each fluid is individually subjected to temperature control by a corresponding temperature control unit such that the temperature of the fluid increases as the position of the substrate, which is supplied with the fluid, approaches the edge portion from the central portion of the substrate. This allows the apparatus to reduce a temperature difference of the substrate arising from a difference in the circumferential velocity between the central portion and the edge portion of the substrate, thereby uniformizing the substrate treatments with a treatment solution.

Japanese Patent Application Laid-Open. No. 2012-151439 discloses a substrate treating apparatus including an upper nozzle and a rod-shaped lower nozzle. The upper nozzle is caused to scan the portion between the central section and the peripheral section of the substrate above a circular substrate that rotates in a horizontal plane. The lower nozzle is extended from below the central section of the substrate to below the peripheral section thereof. The upper nozzle includes a nozzle capable of discharging a chemical solution such as a dilute hydrofluoric acid to the upper surface of the substrate and a nozzle capable of discharging pure water or a rinse solution such as a mixed fluid of pure water and an inert gas to the upper surface of the substrate. The lower nozzle includes a large number of discharge ports that face the lower surface of the substrate and are capable of discharging the rinse solution to the lower surface of the substrate. The apparatus first discharges a chemical solution to the substrate from the upper and lower nozzles to perform a treatment with a chemical solution (chemical solution treatment). Subsequently, the apparatus performs a rinsing treatment by discharging a rinse solution from the nozzles, and then, rotates the substrate at high speed to perform a drying treatment of drying the substrate by draining out the liquid adhering to the substrate.

An airflow cutting across the lower nozzle and flowing in the direction of rotation of the substrate is formed below the substrate. The cross-section of the lower nozzle in the plane perpendicular to the radial direction of the substrate has a wing shape. More specifically, the lower surface of the lower nozzle is a horizontal surface extending in the radial direction of the substrate. The lower nozzle further includes an upper surface, which is extended parallel to the lower surface and is narrower than the lower surface, an upstream connecting surface that connects the ends upstream in the airflow in the width directions of the upper and lower surfaces, and a downstream connecting surface that connects the ends downstream in the airflow. The upstream connecting surface is much wider and has a gentler slope than the downstream connecting surface. The upstream connecting surface is curved while being recessed to the inside of the lower nozzle, whereas the downstream connecting surface is curved while projecting to the outside of the lower nozzle. The airflow generated through the rotation of the substrate is rectified to impinge upon the lower nozzle and then travel toward the lower surface of the substrate along the upstream connecting surface. In this case, the flow rate also increases thanks to the diaphragm effect. The chemical solution and the rinse solution, discharged from the lower nozzle to the lower surface of the substrate in the chemical solution treatment and the rinsing treatment, are diffused smoothly along the lower surface of the substrate through the airflow.

In such a general substrate treating apparatus, the treatment amount (such as an etching amount) in the thickness direction of the substrate varies greatly due to, for example, a change of about $0.1°$ C. to $0.2°$ C. in substrate temperature (treatment temperature). The substrate treating apparatus of Japanese Patent No. 5123122 has a problem: the apparatus has difficulty in achieving a desired treatment amount because the substrate temperature varies due to a temperature difference between the treatment solution emitted to the upper surface of the substrate and the fluid supplied to the lower surface of the substrate. For the above-mentioned substrate treating apparatus, the treatment amount such as an etching amount with a treatment solution may not be uniformized unless the temperature distribution in the radial direction of the substrate is made non-uniform, depending on the quality of a film formed on the substrate or the presence or absence of scanning at a treatment solution supply position. The substrate treating apparatus of Japanese Patent No. 5123122, however, has another problem: the apparatus performs temperature control for reducing a temperature difference between the central portion and the edge portion of the substrate, and thus, has difficulty in uniformizing the substrate treatment depending on the substrate treatment conditions. Further, the substrate treating apparatus suffers from an increasing apparatus manufacturing cost associated with an increased number of temperature control units, complicating temperature control.

In the substrate treating apparatus of Japanese Patent Application Laid-Open No. 2012-151439, the downstream connecting surface of the lower nozzle has a steep gradient, which makes it difficult for the airflow along the upstream connecting surface of the lower nozzle toward the lower surface of the substrate to flow along the downstream connecting surface after passing through the upper surface of the lower nozzle. For this reason, also after the draining treatment, the liquid such as the rinse solution adhering to the downstream connecting surface of the lower nozzle is not thoroughly drained out to be left. The remaining solution causes a problem: it triggers a watermark or particle when the treatment is performed with a different chemical solution or when another substrate is treated.

The substrate treating apparatus of Japanese Patent Application Laid-Open No. 2012-151439 needs to fix a one-end portion of the lower nozzle, which is below the central section of the substrate, and a support member, which is inserted through a cylindrical rotating spindle of a spin chuck holding the substrate, with screws or the like. In the one-end portion of the lower nozzle is provided a structure for fixing with a screw or the like. This allows the chemical solution to be easily left in the lower nozzle, particularly in the one-end portion, after the rinsing treatment. As a result, in the case where, for example, a plurality of chemical solutions are used in combination in the chemical solution treatment and the rinsing treatment in order, the action of a new chemical solution is damaged due to the remaining chemical solution.

SUMMARY OF THE INVENTION

The present invention is directed to a substrate treating apparatus.

The substrate treating apparatus according to one aspect of the present invention includes: a rotating and holding unit that rotates a substrate while horizontally holding the substrate; a first supply source that supplies first pure water having a first temperature; a second supply source that supplies second pure water having a second temperature higher than the first temperature; a pipe system that guides the first pure water by dividing the first pure water into one first pure water and the other first pure water; a treatment solution supply unit that is supplied with the one first pure water from the pipe system and supplies a treatment solution to a central section of an upper surface of the substrate, the treatment solution containing the one first pure water and a chemical solution mixed so as to mainly contain the one first pure water; a first supply unit that is supplied with the other first pure water from the pipe system and supplies a first liquid mainly containing the other first pure water to a central section of a lower surface of the substrate; a second supply unit that supplies a second liquid mainly containing the second pure water supplied from the second supply source to a peripheral section of the lower surface of the substrate and to an intermediate section of the lower surface between the peripheral section and the central section; and a heat amount control unit that independently controls an amount of heat to be supplied to the substrate by the first supply unit and an amount of heat to be supplied to the substrate by the second supply unit such that a temperature distribution in a radial direction of the substrate is changeable.

In the apparatus, the treatment solution and the first liquid supplied to the upper surface and the lower surface, respectively, of the central section of the substrate mainly contain the first pure water supplied from a common supply source. This reduces a temperature difference between the treatment solution and the first liquid, causing the central section of the substrate to easily reach a temperature according to a desired treatment amount in the thickness direction of the substrate. Also, the rotation of the substrate enables a supply of the second liquid mainly containing the second pure water having a temperature higher than that of the first pure water to the peripheral section and the intermediate section of the substrate in which temperature is more likely to drop than in the central section. This more easily uniformizes the temperature distribution in the radial direction of the substrate. Further, if the obtained temperature distribution in the radial direction of the substrate is not uniform, an amount of heat to be supplied to the central section of the lower surface of the substrate through the first liquid and an amount of heat to be supplied to the intermediate section and the peripheral section of the lower surface of the substrate through the second liquid are independently controlled, changing the temperature distribution in the radial direction of the substrate. A difference between a desired treatment amount and an actual amount and variations in treatment amount at the respective portions of the substrate can be reduced at low cost through control of the amount of heat supplied from two systems, namely, a supply system for the first liquid and a supply system for the second liquid.

The present invention is also directed to a method of treating a substrate. This method includes steps corresponding to the operations of the substrate treating apparatus described above.

The substrate treating apparatus according to another aspect of the present invention includes: a rotating and holding unit that rotates a substrate while horizontally holding the substrate; and a lower nozzle that is extended, between the lower surface of the substrate and the rotating and holding unit, from below the central portion of the substrate to below the edge portion of the substrate while having a flat rod shape with a small thickness in a direction perpendicular to the lower surface of the substrate, the lower nozzle discharging the liquid to the lower surface of the substrate. The lower nozzle includes: a downstream end in a direction of rotation of the substrate; an upstream end in the direction of rotation; and a central portion having a horizontal upper surface and a horizontal lower surface and being connected to the downstream end and the upstream end. The downstream end of the lower nozzle is provided with a thin wall portion that becomes thinner as being located more downstream in the direction of rotation with a slope gradient gentler than that of the upstream end.

In the apparatus, the thin wall portion provided at the downstream end of the lower nozzle in the direction of rotation of the substrate has a thinner wall as it is more downstream in the direction of rotation with a slope gradient gentler than that of the end upstream in the direction of rotation. The airflow formed through the rotation of the substrate is more likely to flow along the surface of the thin wall portion after flowing along the upper surface and the lower surface of the lower nozzle, reducing a liquid remaining in the nozzle surface after the draining treatment.

The present invention is also directed to a method of treating a substrate by a substrate treating apparatus. The substrate treating apparatus includes a rotating and holding unit configured to rotate a substrate while horizontally holding the substrate, and a lower nozzle configured to discharge a predetermined liquid to a lower surface of the substrate. The lower nozzle includes a proximal portion facing a central section of the lower surface of the substrate held by the rotating and holding unit, and an extended portion extended from the proximal portion to below a peripheral section of the lower surface of the substrate. The proximal portion of the lower nozzle includes a central discharge port that faces the central section of the lower surface of the substrate and is configured to discharge the liquid to the central section, and the extended portion of the lower nozzle includes a peripheral discharge port that faces an edge area of the lower surface of the substrate other than the central section and is configured to discharge the liquid to the edge area. The method of treating a substrate includes: a rotating and holding step of rotating the substrate while horizontally holding the substrate by the rotating and holding unit; a chemical solution treating step of, concurrently with the rotating and holding step, discharging a treatment solution containing a chemical solution from the lower nozzle to the lower surface of the substrate, to thereby treat the substrate; and a lower nozzle cleaning step of, after the chemical solution treating step, discharging a rinse solution at a first flow rate from the central discharge port of the lower nozzle to the central section of the lower surface of the substrate while discharging a rinse solution at a second flow rate higher than the first flow rate from the peripheral discharge port to the edge area of the lower surface of the substrate, to thereby supply the rinse solutions to the proximal portion of the lower nozzle to clean the proximal portion.

In the method, the rinse solution at the first flow rate is discharged to the central section of the lower surface of the substrate from the central discharge port provided at the proximal portion of the lower nozzle, while the rinse solution at the second flow rate is discharged to the edge area of the lower surface of the substrate from the peripheral discharge port. The rinse solution discharged to the lower surface of the substrate from the lower nozzle spreads along the lower surface of the substrate, and then, falls from the lower surface of the substrate to be supplied to the lower nozzle. The rinse solution discharged to the lower surface of the substrate spreads farther along the lower surface of the substrate with a higher flow rate. The peripheral discharge port, which is farther from the proximal portion of the lower nozzle than the central discharge port, has the second flow rate higher than the first flow rate. Thus, the rinse solutions, namely, the rinse solution that is discharged from the central discharge port and spreads along the lower surface of the substrate and the rinse solution that is discharged from the peripheral discharge port and spreads along the lower surface of the substrate, collide with each other in the portion of the lower surface of the substrate, which is above or near the proximal portion of the lower nozzle and then fall to the lower nozzle together, if the flow rates of those rinse solutions are increased. This enables a supply of much of the rinse solutions to the proximal portion of the lower nozzle. Therefore, the chemical solution remaining in the proximal portion of the lower nozzle can be sufficiently replaced with the rinse solution, reducing a chemical solution remaining in the proximal portion of the lower nozzle.

The present invention therefore has an object to provide a technique of reducing a difference between a desired treatment amount and an actual treatment amount of a substrate and variations in treatment amount at the respective portions of the substrate at low cost. The present invention has another object to provide a technique of reducing, in a substrate treating apparatus including a rod-shaped lower nozzle that discharges a liquid to a lower surface of a substrate, a liquid remaining on a surface of the lower nozzle after the draining processing. The present invention has still another object to provide a technique of reducing, in a substrate treating apparatus including a rod-shaped lower nozzle that discharges, for example, a chemical solution to a lower surface of a substrate, a chemical solution remaining in a one-end portion (proximal portion) of the lower nozzle, which is below a central section of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 graphically shows still another example relationship between the temperature distribution in the radial direction of the substrate and the distribution of an etching amount;

FIG. 15 is a table showing the results of checking the presence or absence of a remaining chemical solution for the plurality of places shown in FIG. 12;

FIG. 16 is a table showing the results of checking the presence or absence of a remaining chemical solution for the plurality of places shown in FIG. 12;

FIG. 17 is a table showing the results of checking the presence or absence of a remaining chemical solution for the plurality of places shown in FIG. 12;

FIG. 18 is a table showing the results of checking the presence or absence of a remaining chemical solution for the plurality of places shown in FIG. 12;

DESCRIPTION OF EMBODIMENTS

Figure 1:
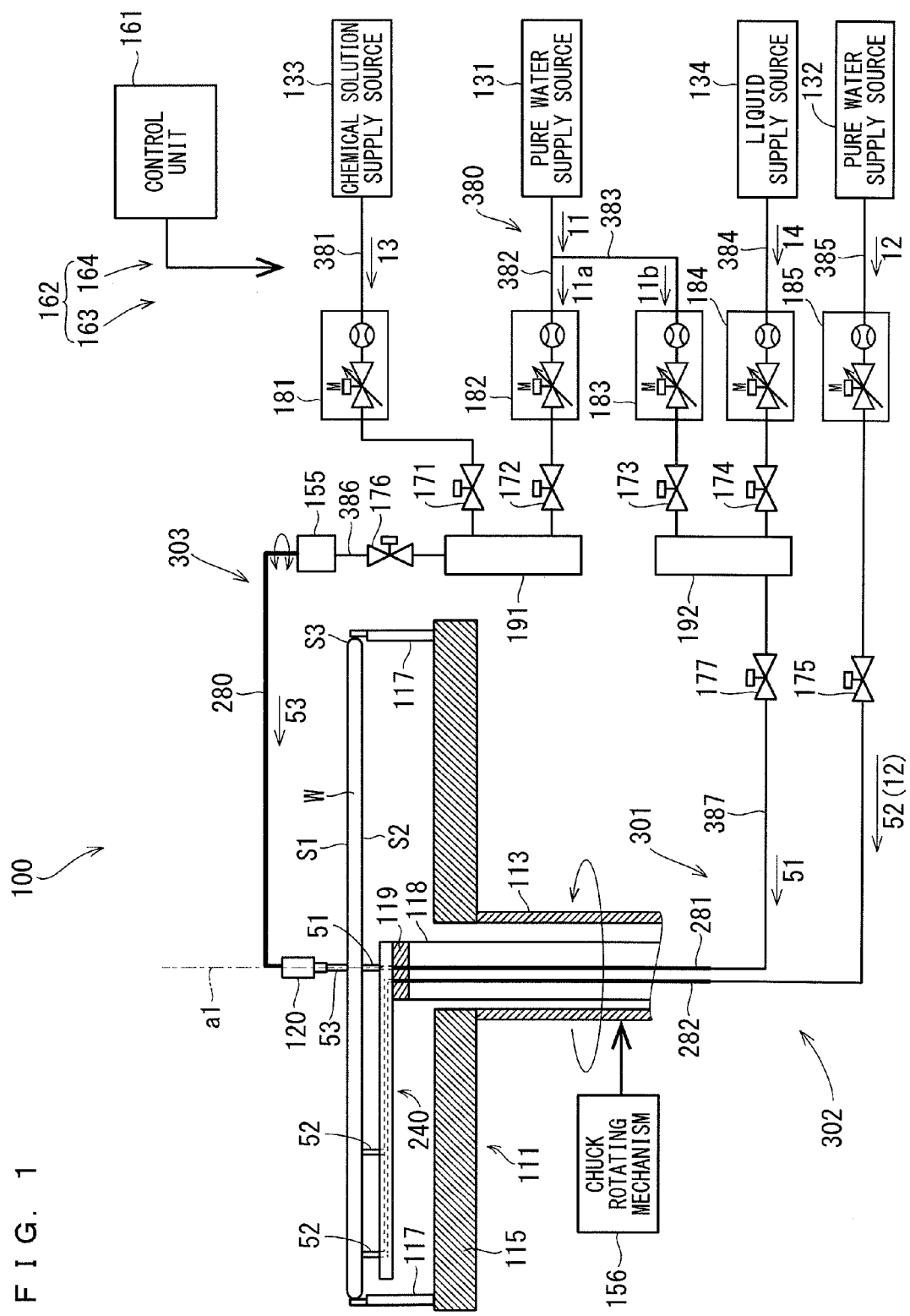
FIG. 1 schematically shows an example schematic configuration of a substrate treating apparatus according to a first embodiment of the present invention.

Hereinafter, embodiments of the present invention are described with reference to the drawings. In the drawings, components having a similar configuration and a similar function are denoted by the same references, and redundant description is omitted in the following. The drawings are each schematically shown. In the description of the embodiments, the top-to-bottom direction is the vertical direction, the substrate W side is the upper side, and the spin chuck 111 side is the lower side.

1. First Embodiment 1-1. Configuration of Substrate Treating Apparatus

Figure 2:
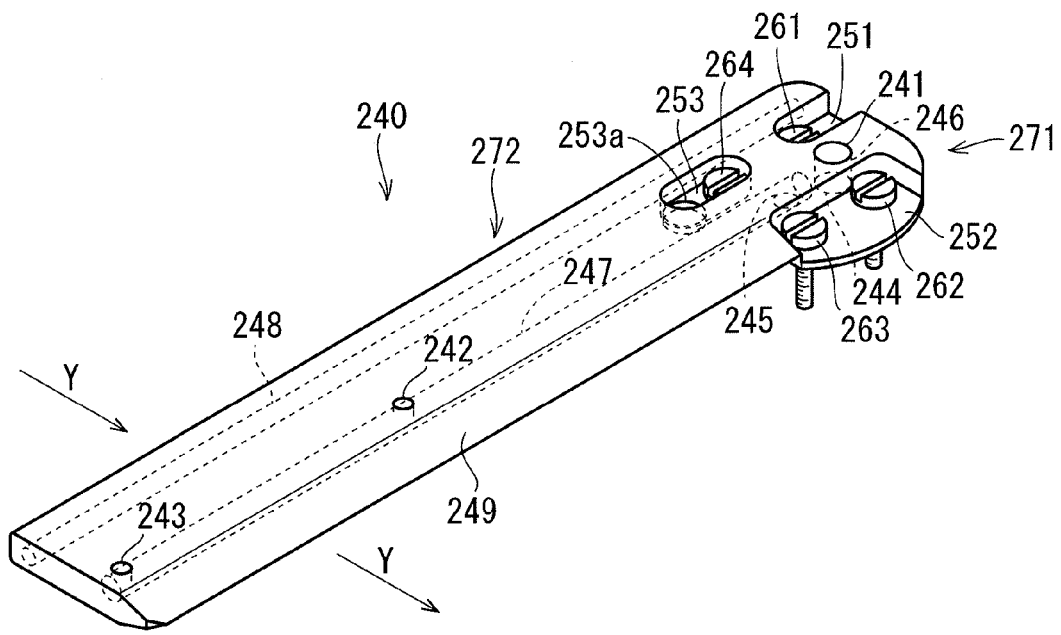
FIG. 2 is a perspective view showing the configuration of a lower nozzle of FIG. 1.
Figure 3:
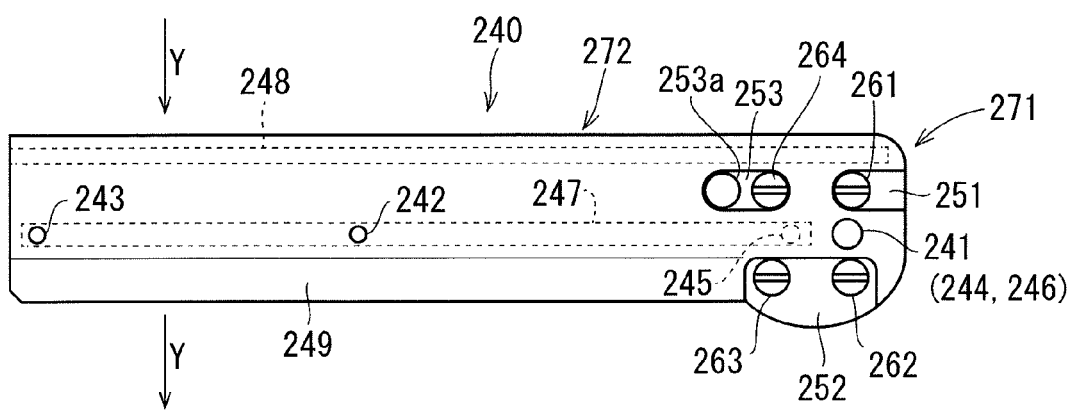
FIG. 3 is a top view showing the configuration of the lower nozzle of FIG. 1.
Figure 4:
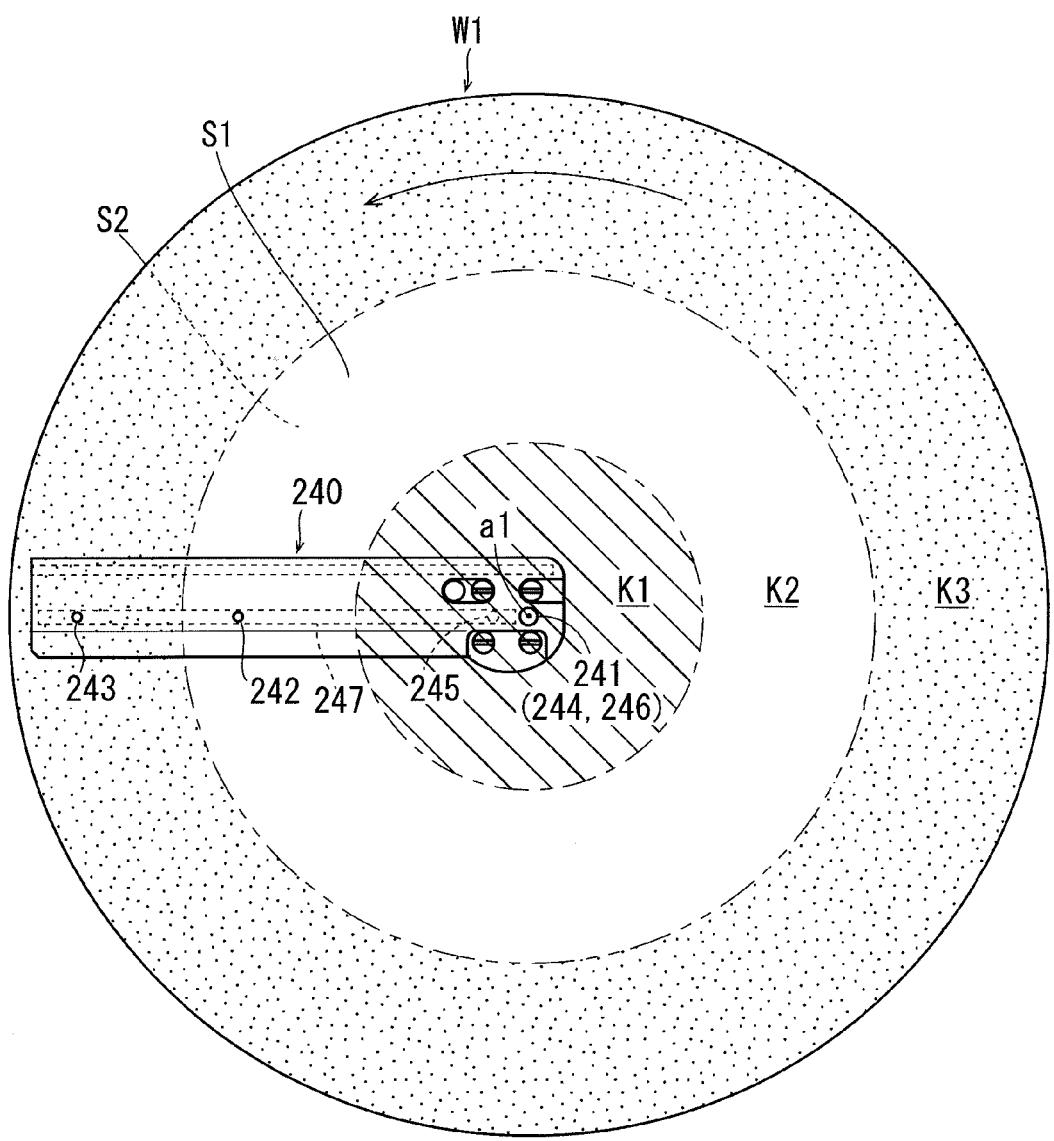
FIG. 4 is a perspective view of the lower nozzle below a substrate, viewed from above the substrate of FIG. 1.

FIG. 1 schematically shows an example schematic configuration of a substrate treating apparatus 100 according to a first embodiment. FIG. 2 is a perspective view showing the configuration of a lower nozzle 240. FIG. 3 is a top view showing the configuration of the lower nozzle 240. FIG. 4 is a perspective view of the lower nozzle 240 provided below the substrate W, which is viewed from above the substrate W. FIG. 4 shows the lower nozzle 240 by a solid line.

The substrate treating apparatus 100 treats a substrate with a treatment solution containing a chemical solution ("chemical solution treatment"). Specifically, the substrate treating apparatus 100 etches an upper surface (also referred to as a "front surface") S1 of a substrate W such as a semiconductor wafer using, for example, an etching solution as a treatment solution, thereby removing a thin film (waste material) formed on the upper surface S1. Alternatively, the treatment solution may be, for example, a cleaning solution. A lower surface S2 opposite the upper surface S1 is also referred to as a "rear surface." The front surface of the substrate W has a substantially circular shape, and the upper surface S1 of the substrate W is a device forming surface on which a device pattern is formed.

As shown in FIG. 1, the substrate treating apparatus 100 includes a spin chuck ("rotating and holding unit") 111 that holds the substrate W in a substantially horizontal position and rotates the substrate W, with the upper surface S1 facing upward. The spin chuck 111 has a cylindrical-shaped rotating spindle 113 connected to the rotation axis of a chuck rotating mechanism ("rotary unit") 156 including a motor and is capable of rotating about a rotation axis (vertical axis) a1, that is, in a substantially horizontal plane, through driving of the chuck rotating mechanism 156.

To the upper end of the rotating spindle 113, a disc-shaped spin base 115 is integrally connected using a fastening component such as a screw. Thus, the operation of the chuck rotating mechanism 156 in response to a motion command from a control unit 161 that controls the entire apparatus causes the rotating spindle 113 and the spin base 115 to integrally rotate about the rotation axis a1. The control unit 161 also controls the chuck rotating mechanism 156 to adjust a rotational speed. The control unit 161 is enabled by, for example, a CPU executing a program stored in a memory.

In the vicinity of the edge portion of the spin base 115, a plurality of chuck pins 117 for gripping an edge portion S3 of the substrate W are provided in a standing manner. It suffices that three or more chuck pins 117 are provided to reliably hold the circular substrate W, which are arranged at equal angular intervals along the edge portion of the spin base 115. Each chuck pin 117 includes a substrate supporter and an edge holder. The substrate supporter supports the edge portion S3 of the substrate W from below. The edge holder presses the edge portion S3, supported by the substrate supporter, toward the center of the substrate W from the side to hold the substrate W. Each chuck pin 117 is configured to switch between a pressing state in which the edge holder presses the edge portion S3 of the substrate W and a release state in which the edge holder is apart from the edge portion S3.

The substrate treating apparatus 100 brings the plurality of chuck pins 117 to the release state when the substrate W is passed to the spin base 115 and brings the plurality of chuck pins 117 to the pressing state when the substrate W is, for example, etched or cleaned. When being brought to the pressing state, the plurality of chuck pins 117 can grip the edge portion S3 of the substrate W to hold the substrate W in a substantially horizontal position with a predetermined distance from the spin base 115. This allows the substrate W to be supported with the surface (pattern forming surface) S1 facing upward and the lower surface S2 facing downward, so that the rotation axis a1 passes through the centers of the upper surface S1 and the lower surface S2.

In the central portion of the spin base 115, a through hole connected to the through hole of the rotating spindle 113 is formed. A tubular body 118 is inserted through this through hole and the through hole of the rotating spindle 113. To the upper end of the tubular body 118, a flat-shaped pedestal 119 is mounted so as to close the opening of the upper end. The upper surface of the pedestal 119 is a horizontal surface. A one-side portion ("proximal portion") 271 of the elongated lower nozzle 240 extended along the lower surface S2 of the substrate W is fixed to the upper surface.

The lower nozzle 240 includes a one-side portion 271 and an extended portion 272 extended from the one-side portion 271 to below a peripheral section K3 of the lower surface S2 of the substrate W, and has a flat shape. The upper surface and the lower surface of the lower nozzle 240 (to be more precise, a portion other than a draining part 249 described below) are horizontal surfaces. Both of the upper surface and the lower surface are main surfaces of the lower nozzle 240. The lower surface of the one-side portion 271 of the lower nozzle 240 in the longitudinal direction and the upper surface of the pedestal 119 abut each other below a central section K1 of the lower surface S2 of the substrate W such that a discharge port 241 provided in the upper surface of the lower nozzle 240 is located below the center of the substrate W. The other end of the lower nozzle 240 in the longitudinal direction reaches below the peripheral section K3 of the lower surface S2. The length from the rotation axis a1 to the other end of the lower nozzle 240 is set to be smaller than the radius of a track of rotation of the chuck pin 117 such that the chuck pin 117 provided in a sanding manner on the rotating spin base 115 does not interfere with the lower nozzle 240.

The pedestal 119 is fixed to the one-side portion 271 of the lower nozzle 240 with screws 261 to 264. Counterbores 251 to 253 are formed in the upper surface of the one-side portion 271 of the lower nozzle 240. A through hole corresponding to the screw 261 is formed in the bottom of the counterbore 251, two through holes corresponding to the screws 262 and 263 are formed in the bottom of the counterbore 252, and a through hole corresponding to the screw 264 is formed in the bottom of the counterbore 253. Screw holes, which are respectively in communication with the through holes, are formed in the upper surface of the pedestal 119. When the pedestal 119 is fixed to the lower nozzle 240 with the screws 261 to 264, the head of the screw 261 is accommodated in the counterbore 251, the heads of the screws 262 and 263 are accommodated in the counterbore 252, and the head of the screw 264 is accommodated in the counterbore 253. As a result, the heads of the screws 261 to 264 do not project from the upper surface of the lower nozzle 240.

The counterbore 251 is formed in the portion, upstream in the direction of rotation of the substrate W (on the upper side in FIG. 3) relative to the line connecting the discharge ports 241 and 243, of the upper surface of the one-side portion of the lower nozzle 240, and is also open to the lateral surface on the one-end side of the lower nozzle 240 in the longitudinal direction. The counterbore 252 is formed in the portion, downstream in the direction of rotation of the substrate W (on the lower side in FIG. 3) relative to the line connecting the discharge ports 241 and 243, of the upper surface of the one-side portion of the lower nozzle 240, and is also open to the lateral surface of the lower nozzle 240 downstream in the direction of rotation of the substrate W (on the lower side in FIG. 3). The counterbore 253 is formed in the portion of the upper surface of the one-side portion of the lower nozzle 240, which is upstream in the direction of rotation of the substrate W relative to the line connecting the discharge ports 241 and 243 and is on the other-end side of the lower nozzle 240 in the longitudinal direction relative to the counterbore 251.

To prevent or reduce a deformation such as a curve due to heat, the lower nozzle 240 includes a core 248 made of stainless steel that penetrates the lower nozzle 240 in the longitudinal direction. The portion of the lower nozzle 240 other than the core 248 is formed of, for example, resin. The core 248 is provided in the lower nozzle 240, along the end upstream in the direction of rotation of the substrate W, upstream in the direction of rotation relative to the counterbores 251 and 253. Thus, the counterbore 253 is open only to the upper surface among the upper surface and the lateral surfaces of the lower nozzle 240. In the bottom of the counterbore 253 is formed a drain hole 253a penetrating the lower nozzle 240 from the bottom to the lower surface of the lower nozzle 240. The drain hole 253a is open to the portion of the lower surface of the lower nozzle 240, which does not face the pedestal 119.

In the portion of the end of the lower nozzle 240 downstream in the direction of rotation of the substrate W, which is on the other-end side in the longitudinal direction relative to the counterbore 252, the draining part 249 is extended along the longitudinal direction of the lower nozzle 240. The draining part 249 is formed to be thinner as closer to the downstream side in the direction of rotation of the substrate W, and has a cross-section in, for example, a triangular shape. The substrate treating apparatus 100 treats the substrate W with a treatment solution 53 and then performs a rinsing treatment by discharging pure water to the rear surface of the substrate W from the lower nozzle 240. After the rinsing treatment, the substrate treating apparatus 100 performs a draining treatment for removing water droplets adhering to the lower nozzle 240. The rinsing treatment and the draining treatment are performed concurrently with the rotation of the substrate W. The rotation of the substrate W forms, below the substrate W, an airflow that cuts across the lower nozzle 240 and flows in the direction of rotation of the substrate W. The airflow flows along the arrow Y in the portion near the lower nozzle 240. The direction of the arrow Y is perpendicular to the extending direction (radial direction of the substrate W that is perpendicular to the rotation axis a1) of the lower nozzle 240 in a horizontal plane. The arrow Y is pointing downstream in the direction of rotation of the substrate W in the lower nozzle 240. The draining part 249, which is formed in the lower nozzle 240, increases the efficiency of removing water droplets in the draining treatment.

The pedestal 119 has through holes vertically penetrating the pedestal 119 at portions facing inlets 244 and 245 provided in the lower surface of the lower nozzle 240. Supply tubes 281 and 282 for supplying a liquid 51 and a liquid 52, respectively, to the lower nozzle 240 are inserted through the tubular body 118. To adjust the temperature distribution of the substrate W, the liquid 51 and the liquid 52 are discharged from the lower nozzle 240 to the lower surface S2 of the substrate W. The upper end portions of the supply tubes 281 and 282 respectively penetrate the pedestal 119 in the through holes corresponding to the inlets 244 and 245 of the through holes of the pedestal 119 to be connected with the inlets 244 and 245.

The lower nozzle 240 discharges the liquids 51 and 52 to the lower surface S2 of the substrate W held by the spin chuck 111. Inside the lower nozzle 240, flow paths 246 and 247 that respectively guide the liquids 51 and 52 are formed in the portion between the counterbores 251 and 253 and the counterbore 252. The flow path 246 vertically penetrates the one-side portion 271 of the lower nozzle 240 in the longitudinal direction. The opening of the flow path 246 in the lower surface of the lower nozzle 240 serves as the inlet 244 that introduces the liquid 51 into the flow path 246, and the opening of the flow path 246 in the upper surface of the lower nozzle 240 serves as the discharge port 241 that discharges the liquid 51 to the central section K1 of the lower surface of the substrate W. The discharge port 241 faces the central section K1.

The flow path 247 extends, inside the lower nozzle 240, from one side to the other side of the lower nozzle 240 in the longitudinal direction along the radial direction of the substrate W. The flow path 247 is open to the lower surface of the one-side portion 271 of the lower nozzle 240 in the longitudinal direction, and this opening serves as the inlet 245 that introduces the liquid 52 to the flow path 247. The flow path 247 is open, in the upper surface of the lower nozzle 240, at the central portion and the other-side portion of the lower nozzle 240 in the longitudinal direction. The opening at the central portion out of these openings serves as the discharge port 242 that discharges the liquid 52 to an intermediate section K2 of the lower surface S2 of the substrate W. The opening at the other-side portion serves as the discharge port 243 from which the liquid 52 is discharged to the peripheral section K3 of the lower surface S2. The discharge port 242 faces the intermediate section K2, and the discharge port 243 faces the peripheral section K3. The intermediate section K2 and the peripheral section K3 constitute an edge area of the lower surface S2 of the substrate W other than the central section K1. In other words, the discharge port 242 and the discharge port 243 are provided in the extended portion 272, which are peripheral discharge ports that discharge the liquid 52 to the edge area.

With reference to FIG. 4, the central section K1 is an area circled by a dashed line and diagonally hatched. The peripheral section K3 is a dot-patterned area between the edge of the substrate W and the circle indicated by a chain double-dashed line. The intermediate section K2 is an area between the central section K1 and the peripheral section K3. The intermediate section K2 is an area of the substrate W, having a distance radially extending from the center of the substrate W, namely, a distance radially extending from the rotation axis a1, that is, for example, one-third to two-thirds of the radius of the substrate. Specifically, for example, the intermediate section K2 in the substrate having a radius of 150 mm is an area having a distance from the center of the substrate W of, for example, 50 to 100 mm.

Although the central axis of the discharge port 241 coincides with the rotation axis a1 of the substrate W in the example of FIGS. 1 to 4, it suffices that the discharge port 241 is provided so as to discharge the liquid 51 to the central section K1, where the central axis of the discharge port 241 is not required to coincide with the rotation axis a1 of the substrate W. In the example of FIGS. 1 to 4, the discharge ports 241 to 243, the inlets 244 and 245, and the flow paths 246 and 247 are provided in the common lower nozzle 240. Alternatively, two separately formed lower nozzles may be used in place of the lower nozzle 240 such that the discharge port 241, the inlet 244, and the flow path 246 are provided in one of the lower nozzles and that the discharge port 242, the discharge port 243, the inlet 245, and the flow path 247 are provided in the other lower nozzle. Still alternatively, no draining part 249 may be formed.

The substrate treating apparatus 100 discharges the liquids 51 and 52 to the lower surface S2 from the lower nozzle 240 while rotatably driving the spin chuck 111 holding the substrate W as described above by the chuck rotating mechanism 156 to rotate the substrate W at a predetermined rotational speed, thereby adjusting the temperature of the substrate W. Then, the substrate treating apparatus 100 supplies the treatment solution 53 to the upper surface S1 of the substrate from an upper nozzle 120 described below, thereby performing a predetermined treatment (such as an etching treatment) on the substrate W.

At the side of the substrate W held by the spin chuck 111, a nozzle rotation mechanism 155 including a motor is provided. The control unit 161 controls the operation of the nozzle rotation mechanism 155. A tube-shaped, stiff piping arm 280 is attached to the nozzle rotation mechanism 155 in a manner of turning about the nozzle rotation mechanism 155 in a substantially horizontal plane.

One end of the piping arm 280 penetrates the nozzle rotation mechanism 155 to the lower surface thereof, and the other end thereof can be positioned above the central section of the upper surface S1 of the substrate W by the piping arm 280 being turned by the nozzle rotation mechanism 155. The upper nozzle 120 is attached to the other end. When, for example, the substrate W is passed to the spin base 115, the piping arm 280 is turned so that the upper nozzle 120 is retracted from the transport path of the substrate W. In the etching treatment, the rinsing treatment, or other treatment, the position (treatment position) of the upper nozzle 120 is accurately adjusted to be located above the central section of the upper surface S1 through servocontrol. Here, the control unit 161 performs the servocontrol. This enables the adjustment of the position of the upper nozzle 120 in response to a command from the control unit 161.

Inside the piping arm 280, a flow path that supplies the treatment solution 53 to the upper nozzle 120 is provided from the upper end of the upper nozzle 120 to below the lower surface of the nozzle rotation mechanism 155. The upper nozzle 120 discharges the supplied treatment solution 53 downwardly from the discharge port facing the upper surface S1 of the substrate W. This causes the lower nozzle 240 to discharge the treatment solution 53 toward the central section of the upper surface S1 of the substrate W whose temperature distribution is adjusted, so that the substrate W is treated. The centrifugal force by the rotation of the substrate W acts on the discharged treatment solution 53 to cause the treatment solution 53 to spread to the edge portion S3 of the substrate W, allowing the upper surface S1 to be entirely treated.

The nozzle rotation mechanism 155 rotatably drives the piping arm 280 to cause the upper nozzle 120 to perform scanning relative to the track of rotation of the upper surface S1 of the substrate W, allowing the substrate treating apparatus 100 to supply the treatment solution 53 to the entire upper surface S1. Scanning by the upper nozzle 120 as described above further improves uniformity in treatment. The above-mentioned scanning is performed by the upper nozzle 120 traveling between, for example, above the central section of the upper surface S1 and above the peripheral section thereof. In other words, the nozzle rotation mechanism 155 causes the upper nozzle 120 supplying the treatment solution 53 to the upper surface S1 of the substrate W to perform scanning above the upper surface S1 of the substrate W, and accordingly operates as a scanning unit that scans the supply position of the treatment solution 53 on the upper surface S1 of the substrate W between the central section and the peripheral section of the upper surface S1 of the substrate W. A scan mechanism may be used in place of the nozzle rotation mechanism 155 and the piping arm 280, which causes the upper nozzle 120 to perform linear scanning above the upper surface S1.

The substrate treating apparatus 100 further includes a pure water supply source ("first supply source") 131 that supplies pure water ("first pure water") 11 having a first temperature, a pure water supply source ("second supply source") 132 that supplies pure water ("second pure water") 12 having a second temperature higher than the first temperature, a chemical solution supply source 133 that supplies a chemical solution 13, and a liquid supply source 134 that supplies a liquid 14. The chemical solution 13 may be, for example, hydrogen fluoride (HF), ammonium hydroxide ($NH_4OH$), hydrochloride acid (HCL), or hydrogen peroxide ($H_2O_2$). The chemical solution supply source 133 may supply a plurality of chemical solutions as the chemical solution 13. The liquid 14 is preferably pure water or the chemical solution 13.

Each of the pure water supply sources 131 and 132, the chemical solution supply source 133, and the liquid supply source 134 contains a heater capable of heating a liquid to be supplied, a temperature sensor capable of detecting the temperature of a liquid, and delivering means for delivering the liquid, such as a pump (which are not shown).

The control unit 161 controls the calorific value of each heater such that the temperature of the liquid detected by each temperature sensor reaches a target temperature, thereby controlling the temperatures of the pure water 11, the pure water 12, the chemical solution 13, and the liquid 14 supplied by the pure water supply sources 131 and 132, the chemical solution supply source 133, and the liquid supply source 134, respectively.

More specifically, the control unit 161 controls the respective heaters on the basis of the temperatures detected by the temperature sensors of the pure water supply sources 131 and 132 to set the temperature of the pure water 11 supplied by the pure water supply source 131 to the first temperature and also set the temperature of the pure water 12 supplied by the pure water supply source 132 to the second temperature higher than the first temperature. The control unit 161 can freely control the first temperature and the second temperature within a predetermined temperature range in accordance with the predetermined setting information. The control unit 161, the temperature sensor and the heater of the pure water supply source 131, and the temperature sensor and the heater of the pure water supply source 132 constitute a temperature control unit 164 capable of freely controlling the first temperature of the pure water 11 and the second temperature of the pure water 12 within a predetermined temperature range. In other words, the temperature control unit 164 performs temperature control of controlling the temperature (first temperature) of the pure water 11 in the pure water supply source 131 and the temperature (second temperature) of the pure water 12 in the pure water supply source 132.

The control unit 161 can freely control the temperatures of the chemical solution 13 and the liquid 14 within a predetermined temperature range in accordance with the predetermined setting information by controlling the heaters contained in the chemical solution supply source 133 and the liquid supply source 134. The control unit 161 preferably controls the temperature of the liquid 14 and the temperature of the chemical solution 13 (in the case where the chemical solution supply source 133 supplies a plurality of chemical solutions as the chemical solution 13, the temperature of each chemical solution) to be the same temperature.

The substrate treating apparatus 100 further includes a mixing unit 191 and a mixing unit 192. Each of the mixing unit 191 and the mixing unit 192 is configured as, for example, a mixing valve. The mixing unit 191 is connected with the chemical solution supply source 133 by a pipe 381 and is connected with the pure water supply source 131 by a pipe 382. The mixing unit 191 is connected with one end of the piping arm 280 reaching the lower end of the nozzle rotation mechanism 155, by a pipe 386. The mixing unit 192 is connected with the pure water supply source 131 by part of the pipe 382 and a pipe 383 branched off from the path of the pipe 382 and is connected with the liquid supply source 134 by a pipe 384. The mixing unit 192 is connected with the supply tube 281 by a pipe 387.

The portion of the pipe 382, which is downstream relative to the branching portion at which the pipe 383 is branched off, delivers pure water ("one first pure water") 11a of the pure water 11 supplied by the pure water supply source 131. The pipe 383 delivers pure water ("the other first pure water") 11b of the pure water 11. The pipe 382 and the pipe 383 constitute a pipe system 380. In other words, the pipe system 380 is a branched pipe that has one end connected to the pure water supply source 131 and is branched off at some midpoint in a conduit. The pipe system 380 divides the pure water 11 supplied by the pure water supply source 131 into the pure water 11a and the pure water 11b, and guides the pure water 11a to the mixing unit 191 and guides the pure water 11b to the mixing unit 192.

The pipe system 380 may include a pipe that has one end connected with the pure water supply source 131 and the other end connected with the mixing unit 192 in place of the pipe 383 branched off from the pipe 382 such that this pipe and the pipe 382 divide the pure water 11 supplied by the pure water supply source 131 into the pure water 11a and the pure water 11b.

The pure water supply source 132 is connected with the supply tube 282 by the pipe 385 to supply, as the liquid 52, the pure water 12 to the supply tube 282 through the pipe 385.

A flow rate controller 181 and an open/close valve 171 are provided at some midpoint in the path of the pipe 381, a flow rate controller 182 and an open/close valve 172 are provided at some midpoint in the path of the pipe 382, a flow rate controller 183 and an open/close valve 173 are provided at some midpoint in the path of the pipe 383, and a flow rate controller 184 and an open/close valve 174 are provided at some midpoint in the pipe 384. A flow rate controller 185 and an open/close valve 175 are provided at some midpoint in the path of the pipe 385, and an open/close valve 176 is provided at some midpoint in the path of the pipe 386. In the case where the chemical solution supply source 133 concurrently supplies a plurality of chemical solutions as the chemical solution 13, the pipe 381 is composed of a plurality of pipes, where a flow rate controller and an open/close valve are provided per pipe. In other words, in this case, the flow rate controller 181 and the open/close valve 171 are composed of a plurality of flow rate controllers and a plurality of open/close valves, respectively.

Each of the flow rate controllers 181 to 185 includes, for example, a flowmeter that detects the flow rate of a liquid flowing through the pipe thereof and a variable valve capable of adjusting the flow rate of the liquid in accordance with a valve open/close amount. The control unit 161 controls, for the flow rate controllers 181 to 185, the open/close amounts of the variable valves of the flow rate controllers 181 to 185 via a valve control mechanism (not shown) such that the flow rates detected by the flowmeters reach target flow rates. The control unit 161 sets target flow rates within a predetermined range in accordance with the predetermined setting information, thereby freely controlling the flow rates of the liquids passing through the flow rate controllers 181 to 185. The control unit 161 controls the open/close valves 171 to 177 to be opened or closed via the valve control mechanism.

The control unit 161 controls the flow rate of the chemical solution 13 passing through the flow rate controller 181 within a predetermined range and also controls the open/close valve 171 to be opened, so that the chemical solution 13 is supplied to the mixing unit 191. The control unit 161 controls the flow rate of the pure water 11a passing through the flow rate controller 182 within a predetermined range and also controls the open/close valve 172 to be opened, so that the pure water 11a is supplied to the mixing unit 191.

The control unit 161 controls the flow rate controllers 181 and 182 to obtain a predetermined flow rate ratio between the flow rate of the pure water 11a passing through the flow rate controller 182 and the flow rate of the chemical solution 13 passing through the flow rate controller 181 (in the case where the chemical solution 13 includes a plurality of chemical solutions, the respective flow rates of the chemical solutions). This flow rate ratio is a flow rate ratio at which the flow rate of the pure water 11a is higher than the flow rate of the chemical solution 13. For example, in the case where ammonium hydroxide, hydrogen peroxide, and pure water are mixed to prepare an SC-1 liquid as the treatment solution 53, ammonium hydroxide, hydrogen peroxide, and pure water (pure water 11a) are supplied to the mixing unit 191 at a flow rate ratio of, for example, 1:4:20. The control unit 161 can change the flow rate ratio in accordance with the setting information predetermined in accordance with, for example, the type and temperature of the chemical solution 13.

The pure water 11a and the chemical solution 13 supplied to the mixing unit 191 are mixed by the mixing unit 191 at a mixing ratio equal to the flow rate ratio between the pure water 11a and the chemical solution 13, so that the treatment solution 53 is prepared. The control unit 161 controls the open/close valve 176 to be opened, so that the treatment solution 53 is supplied from the mixing unit 191 to the upper nozzle 120 through the pipe 386 and the piping arm 280 and is discharged from the discharge port of the upper nozzle 120 to the central section of the upper surface S1 of the substrate W.

The mixing unit 191, the pipe 386, the open/close valve 176, the nozzle rotation mechanism 155, the piping arm 280, and the upper nozzle 120 constitute a treatment solution supply unit 303. In other words, the treatment solution supply unit 303 is supplied with the pure water 11a from the pipe 382 of the pipe system 380 and supplies the upper surface S1 of the substrate W with a treatment solution 53 obtained by mixing the pure water 11a and the chemical solution 13 mixed so as to mainly contain the pure water 11a.

The control unit 161 controls the flow rate of the pure water 11b passing through the flow rate controller 183 within a predetermined range and also controls the open/close valve 173 to be opened, whereby the pure water 11b is supplied to the mixing unit 192. The control unit 161 controls the flow rate of the liquid 14 passing through the flow rate controller 184 within a predetermined range and also controls the open/close valve 174 to be opened, whereby the liquid 14 is supplied to the mixing unit 192. The control unit 161 controls the flow rate controllers 183 and 184 such that the flow rate of the pure water 11b and the flow rate of the liquid 14 have a predetermined flow rate ratio. This flow rate ratio is a flow rate ratio at which the flow rate of the pure water 11b is higher than the flow rate of the liquid 14. The control unit 161 can also change the flow rate ratio in accordance with the predetermined setting information.

The control unit 161 can control the flow rate controllers 183 and 184 such that the flow rates of the pure water 11b and the liquid 14 vary while keeping the flow rate ratio between the pure water 11b and the liquid 14. The control unit 161 can also control the flow rate controllers 183 and 184 such that the flow rates of the pure water 11b and the liquid 14 vary with the varying flow rate ratio.

When the chemical solution 13 and the liquid 14 have the same temperature, the control unit 161 preferably controls the flow rate ratio between the pure water 11b and the liquid 14 such that the flow rate ratio between the pure water 11b and the liquid 14 that are supplied to the mixing unit 192 is equal to the flow rate ratio between the pure water 11a and the chemical solution 13 that are supplied to the mixing unit 192.

The pure water 11b and the liquid 14 that are supplied to the mixing unit 192 are mixed at a mixing ratio equal to the flow rate ratio between the pure water 11b and the liquid 14 by the mixing unit 192, so that the liquid 51 is prepared. The control unit 161 controls the open/close valve 177 to be opened, so that the liquid 51 is introduced, through the inlet 244, from the mixing unit 192 to the flow path 246 of the lower nozzle 240 via the pipe 387 and the supply tube 281, and is discharged from the discharge port 241 to the central section K1 of the lower surface S2 of the substrate W.

The mixing unit 192, the pipe 387, the open/close valve 177, the supply tube 281, and the flow path 246 and the discharge port 241 of the lower nozzle 240 constitute a first supply unit 301. In other words, the first supply unit 301 is supplied with the pure water 11b from the pipe 383 of the pipe system 380 and supplies the liquid 51 mainly containing the pure water 11b to the central section K1 of the lower surface S2 of the substrate W. The first supply unit 301 preferably mixes the pure water 11b and the liquid 14 for temperature adjustment, which has the same temperature as that of the chemical solution 13, such that the mixing ratio between the pure water 11a and the chemical solution 13 in the treatment solution 53 is equal to the mixing ratio between the pure water 11b and the liquid 14 in the liquid 51, thereby preparing the liquid 51. This further reduces a temperature difference between the liquid 51 and the treatment solution 53.

The control unit 161 controls the flow rate of the pure water 12 passing through the flow rate controller 185 within a predetermined range and controls the open/close valve 175 to be opened, whereby the pure water 12 as the liquid 52 is supplied from the pure water supply source 132 to the supply tube 282 through the pipe 385. Then, the liquid 52 is introduced into the flow path 247 of the lower nozzle 240 from the inlet 245 connected with the supply tube 282 and is discharged to the intermediate section K2 and the peripheral section K3 of the lower surface S2 of the substrate W from the discharge ports 242 and 243. An additional mixing unit such as a mixing valve may be provided at some midpoint in the pipe 385. Also, an additional chemical solution may be supplied to the additional mixing unit at a flow rate lower than the flow rate of the pure water 12 supplied to the additional mixing unit, and the pure water 12 may be mixed with the chemical solution, so that the liquid 52 is prepared. In other words, the liquid 52 may be the pure water 12 per se or a liquid containing the pure water 12 and the chemical solution mixed so as to mainly contain the pure water 12. The pure water 12 per se is a liquid mainly containing the pure water 12.

The pipe 385, the flow rate controller 185, the open/close valve 175, the supply tube 282, and the flow path 247 and the discharge ports 242 and 243 of the lower nozzle 240 constitute a second supply unit 302. In other words, the second supply unit 302 supplies the liquid 52 mainly containing the pure water 12 supplied from the pure water supply source 132 to the peripheral section K3 of the lower surface S2 of the substrate W and to the intermediate section K2 of the lower surface S2 between the peripheral section K3 and the central section K1.

The control unit 161 and the flow rate controllers 183 to 185 constitute a flow rate control unit 163. The flow rate control unit 163 independently controls the flow rate of the liquid 51 containing the pure water 11b and the liquid 14 mixed by the mixing unit 192 and the flow rate of the liquid 52 (pure water 12), thereby independently controlling an amount of heat to be supplied to the substrate W by the first supply unit 301 and an amount of heat to be supplied to the substrate W by the second supply unit 302 such that the temperature distribution in the radial direction of the substrate W is changeable.

The temperature control unit 164 described above independently controls the temperature (first temperature) of the pure water 11 in the pure water supply source 131 and the temperature (second temperature) of the pure water 12 in the pure water supply source 132, thereby independently controlling an amount of heat to be supplied to the substrate W by the first supply unit 301 and an amount of heat to be supplied to the substrate W by the second supply unit 302 such that the temperature distribution in the radial direction of the substrate W is changeable.

The flow rate control unit 163 and the temperature control unit 164 constitute a heat amount control unit 162. The heat amount control unit 162 can thus independently control an amount of heat to be supplied to the substrate W by the first supply unit 301 and an amount of heat to be supplied to the substrate W by the second supply unit 302 such that the temperature distribution in the radial direction of the substrate W is changeable.

Out of the components of the substrate treating apparatus 100, for example, the components other than the pure water supply sources 131 and 132, the chemical solution supply source 133, and the liquid supply source 134 are housed in a common housing whereas the pure water supply sources 131 and 132, the chemical solution supply source 133, and the liquid supply source 134 are installed on, for example, a floor other than the floor on which an installation room is installed. In this case, the branching portion of the pipe system 380, at which the pipe 383 is branched off from the pipe 382, is preferably housed in the housing. The pure water supply sources 131 and 132, the chemical solution supply source 133, and the liquid supply source 134 may also be housed in the housing.

The substrate treating apparatus 100 concurrently rotates the substrate W by the spin chuck 111, supplies the liquid 51 to the central section K1 of the lower surface S2 of the substrate W by the first supply unit 301, supplies the liquid 52 to the intermediate section K2 and the peripheral section K3 of the lower surface S2 by the second supply unit 302, and supplies the treatment solution 53 to the upper surface S1 of the substrate W by the treatment solution supply unit 303. Alternatively, the substrate treating apparatus 100 can supply only the liquid 51 out of the liquid 51 and the liquid 52 to the lower surface S2 of the substrate W. The pure water supply source 131 and the heater or the like, which heats the pure water 11 supplied by the pure water supply source 131 to the second temperature, may constitute the pure water supply source 132. Alternatively, the pure water supply source 132 and the mixing unit, which prepares the pure water having the first temperature by mixing pure water having a temperature lower than the first temperature into the pure water 12 supplied by the pure water supply source 132, may constitute the pure water supply source 131.

1-2. Temperature Distribution in Radial Direction of Substrate and Distribution of Etching Amount FIGS. 5 to 7 graphically show an example relationship between the temperature distribution in the radial direction of the substrate W and the distribution of an etching amount in the case where an etching solution is used as the treatment solution 53. The etching amount is proportional to an etching rate.

Figure 5:
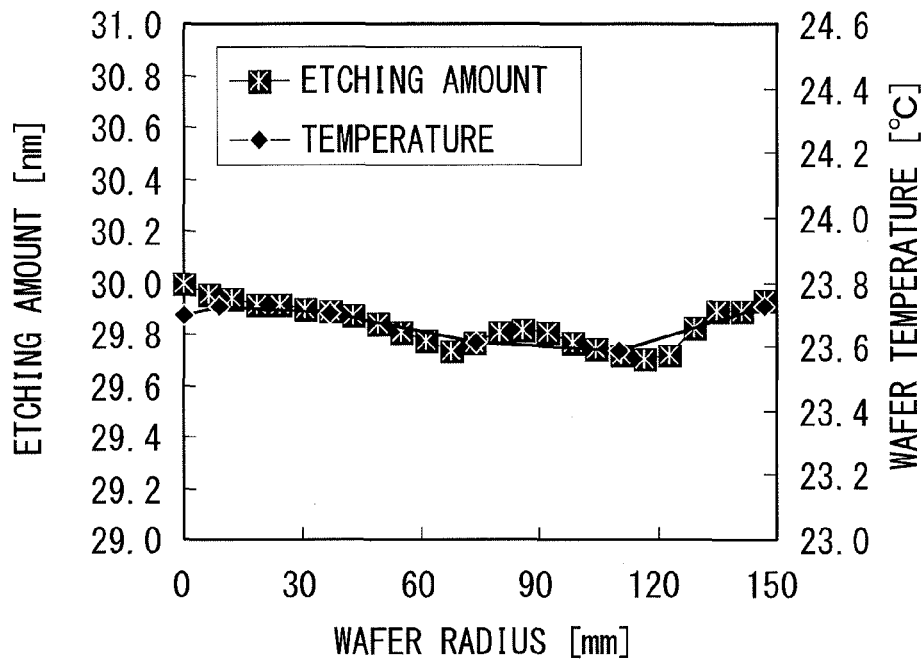
FIG. 5 graphically shows an example relationship between the temperature distribution in the radial direction of the substrate and the distribution of an etching amount.

A film to be treated, which is formed on the substrate W, is a thermal oxide (Th-Oxide) In FIG. 5. A film to be treated is amorphous silicon (a-Si) in FIG. 6. A film to be treated is polysilicon (poly-Si) in FIG. 7.

Figure 6:
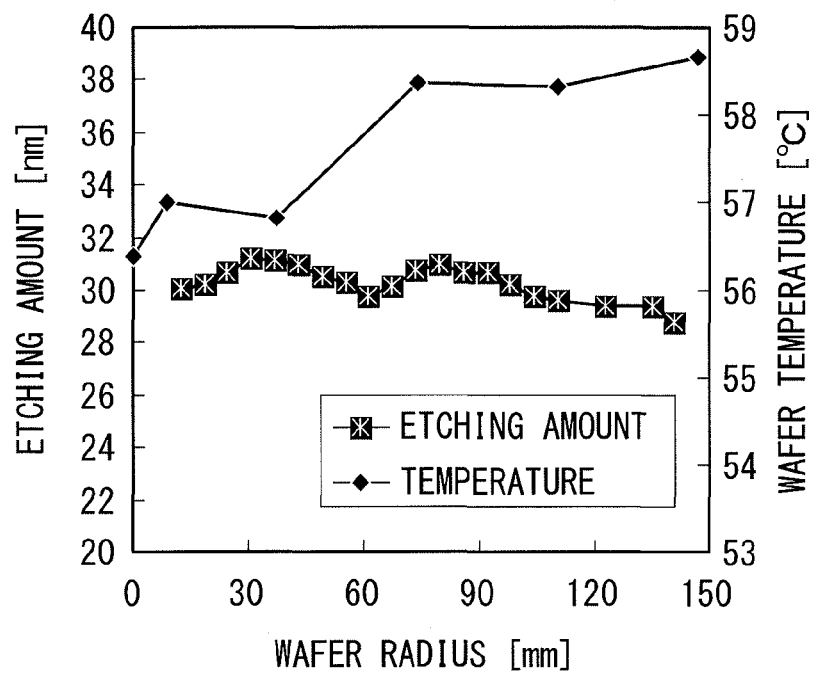
FIG. 6 graphically shows another example relationship between the temperature distribution in the radial direction of the substrate and the distribution of an etching amount.

In the examples of FIGS. 5 to 7, the etching solution is supplied from above the central section of the substrate, and dilute ammonia hydroxide of 40° C., which contains ammonium hydroxide ($NH_4OH$) and pure water mixed at a ratio of 1:5, is used as the etching solution. Etching time is 30 seconds. The temperature distributions of the substrates are set in advance to the temperature distributions shown in FIGS. 5 to 7. Prior to an etching treatment, a cleaning treatment is performed for 30 seconds with dilute hydrofluoric acid (DHF) containing hydrogen fluoride (HF) and pure water mixed at a ratio of 1:100.

In the example of FIG. 5, the temperature in the radial direction of the substrate and the etching amount have an extremely high correlation. In the example of FIG. 6, however, the distribution of an etching amount eventually becomes substantially uniform by setting the temperature distribution in the radial direction of the substrate to the distribution in which temperature becomes higher with a smaller distance from the edge of the substrate. In other words, it can be said that the relationship between temperature and etching amount varies greatly in accordance with a position in the radial direction of the substrate. In the example of FIG. 7, the temperature distribution in the radial direction of the substrate is uniform, but the distribution of an etching amount is non-uniform. Specifically, the etching amount is the smallest in the peripheral section of the substrate and is the largest in the intermediate section of the substrate. The etching amount of the central section of the substrate is larger than that of the peripheral section and is smaller than that of the intermediate section. In other words, it can be said that the relationship between temperature and etching amount varies greatly in accordance with a position in the radial direction of the substrate.

As shown in FIGS. 5 to 7, in accordance with the quality of a film to be treated, which is formed on the substrate, the distribution of an etching amount may be non-uniform even if the temperature distribution in the radial direction of the substrate is made uniform. In this case, the temperature distribution needs to be made non-uniform for a uniform etching amount.

Figure 8:
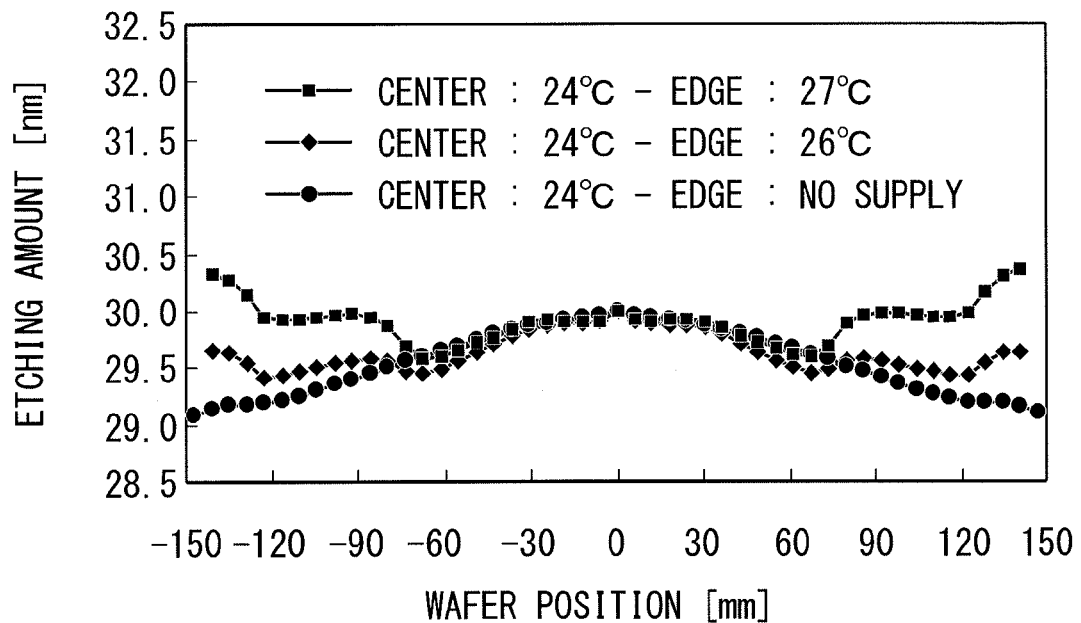
FIG. 8 graphically shows an example relationship between the temperatures of a first liquid and a second liquid and the distribution of an etching amount.
Figure 9:
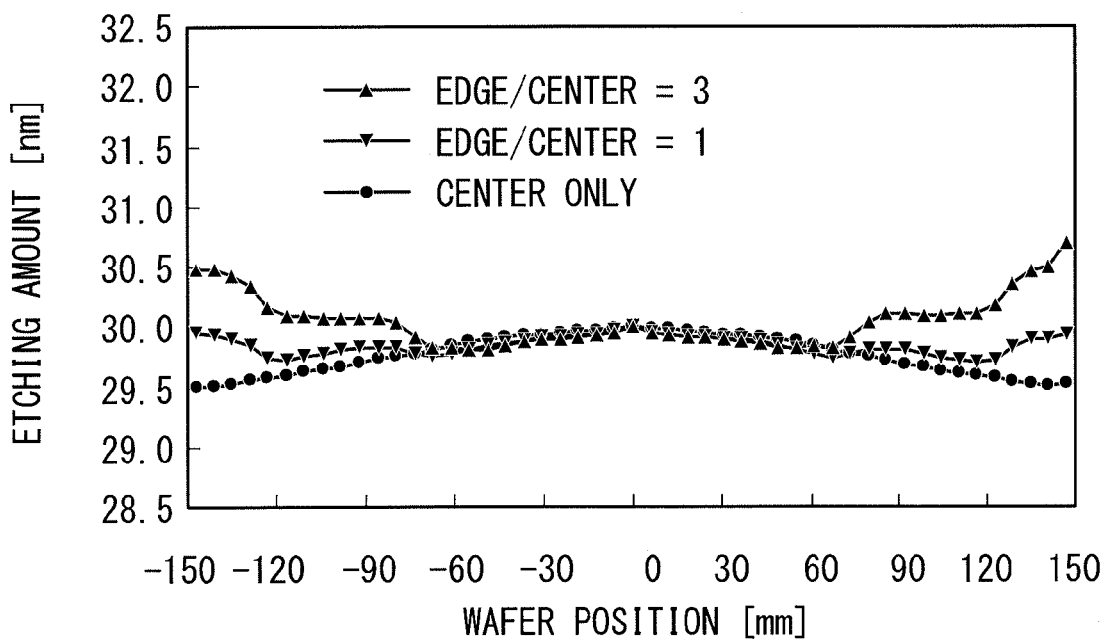
FIG. 9 graphically shows another example relationship between flow rates of the first and second liquids and the distribution of an etching amount.

1-3. Supply Pattern of Amount of Heat Supplied to Substrate W and Distribution of Etching Amount FIGS. 8 and 9 graphically show an example relationship between a supply pattern of an amount of heat to be supplied to the substrate W by the lower nozzle 240 and the distribution of the etching amount in the radial direction of the substrate W. With reference to FIG. 8, an amount of heat supplied to the substrate W is changed by changing the temperatures of the liquid 51 (first liquid) discharged to the central section K1 of the lower surface S2 of the substrate W by the lower nozzle 240 and the liquid 52 (second liquid) discharged to the intermediate section K2 and the peripheral section K3 of the lower surface S2 by the lower nozzle 240. With reference to FIG. 9, an amount of heat supplied to the substrate W is changed by changing the flow rate ratio between the liquid 51 and the liquid 52. Pure water is used as the liquids 51 and 52.

In the examples of FIGS. 8 and 9, an etching solution as the treatment solution 53 is supplied from above the central section of the substrate. Dilute hydrofluoric acid (DHF), containing hydrogen fluoride (HF) and pure water mixed at a ratio of 1:50 and having a temperature adjusted to 24° C., is used as an etching solution. Treatment time is 300 seconds. The film to be treated, which is formed on the substrate W, is thermal oxide (Th-Oxide).

With reference to FIG. 8, a combination of the liquid 51 and the liquid 52 is set in three patterns. In two patterns of the three patterns, both of the liquid 51 and the liquid 52 are supplied at a flow rate of 1000 ml/min. The temperature of the liquid 51 is adjusted to 24° C. in both of the two patterns, while the temperature of the liquid 52 is adjusted to 27° C. in one of the two patterns and is set to 26° C. in the other pattern. In the remaining one pattern of the three patterns of temperature combinations, only the liquid 51 out of the liquids 51 and 52 is supplied at a flow rate of 2000 ml/min. The temperature of the liquid 51 is adjusted to 24° C.

In any of the three types of temperature combinations, in the portion extending from the central section to the intermediate section of the upper surface S1 of the substrate W, an etching amount of the central section is slightly larger but a substantially uniform distribution of an etching amount is obtained as a whole. Meanwhile, the distribution of an etching amount in the portion extending from the intermediate section to the peripheral section differs among the three patterns of temperature combinations. With no supply of the liquid 52, an etching amount decreases with a smaller distance from the edge. With a supply of the liquid 52 of 26°

C., a substantially uniform distribution of an etching amount is obtained. With a supply of the liquid 52 of 27° C., an etching amount increases with a smaller distance from the edge.

It is revealed that on the treatment conditions of FIG. 8 (such as the film thickness of a substrate and how an etching solution is supplied), an etching amount in the radial direction of the substrate can be made substantially uniform by setting the liquid 51 to 24° C. and setting the liquid 52 to 26° C. In the substrate treating apparatus 100, the temperature conditions of the liquid 51 and the liquid 52 that enable an etching amount in the radial direction of the substrate substantially uniform are obtained by, for example, experiments for each treatment condition, which are stored in the memory or the like of the control unit 161 as setting information. The control unit 161 reads the temperature conditions of the liquid 51 and the liquid 52, which correspond to the treatment conditions of the substrate W to be treated, thereby performing control by the temperature control unit 164.

With reference to FIG. 9, a flow rate ratio between the liquid 51 and the liquid 52 is set in three types. Specifically, the flow rate ratio is set in the following three patterns: only the liquid 51 out of the liquids 51 and 52 is supplied and the liquid 52 is not supplied, the liquid 51 and the liquid 52 have the same flow rate, and the flow rate ratio between the liquid 51 and the flow rate of the liquid 52 is 1:3. In any of the three patterns, each of the liquid 51 and the liquid 52 has a temperature of 24° C. With a supply of the liquids 51 and 52, the flow rate of the liquid 51 is 1000 ml/min. With a supply of only the liquid 51 out of the liquids 51 and 52, the flow rate of the liquid 51 is 2000 ml/min.

In any of the three flow rate ratio setting patterns, in the portion extending from the central section to the intermediate section of the upper surface S1 of the substrate W, an etching amount is slightly larger in the central section, but a substantially uniform distribution of an etching amount is obtained as a whole. Meanwhile, the distribution of an etching amount in the portion extending from the intermediate section to the peripheral section differs among the three patterns. With no supply of the liquid 52, an etching amount decreases with a smaller distance from the edge. At a flow rate ratio of 1:1, a substantially uniform distribution of an etching amount is obtained. At a flow rate ratio of 1:3, an etching amount increases with a smaller distance from the edge of the substrate W.

It is revealed that on the treatment conditions of FIG. 9 (such as the film thickness of a substrate and how an etching solution is supplied), an etching amount in the radial direction of the substrate can be made substantially uniform by setting a flow rate ratio between the liquid 51 and the liquid 52 to 1:1. In the substrate treating apparatus 100, the flow rate ratio (flow rate condition) between the liquid 51 and the liquid 52, which enables an etching amount in the radial direction of the substrate substantially uniform, is obtained by, for example, experiments for each treatment condition, which is stored in the memory or the like of the control unit 161 as setting information. The control unit 161 reads the flow rate conditions of the liquid 51 and the liquid 52, which correspond to the treatment conditions of the substrate W to be treated, thereby performing control by the flow rate control unit 163.

1-4. Scanning (of Supply Position of Treatment Solution 53) by Upper Nozzle 120

Figure 10:
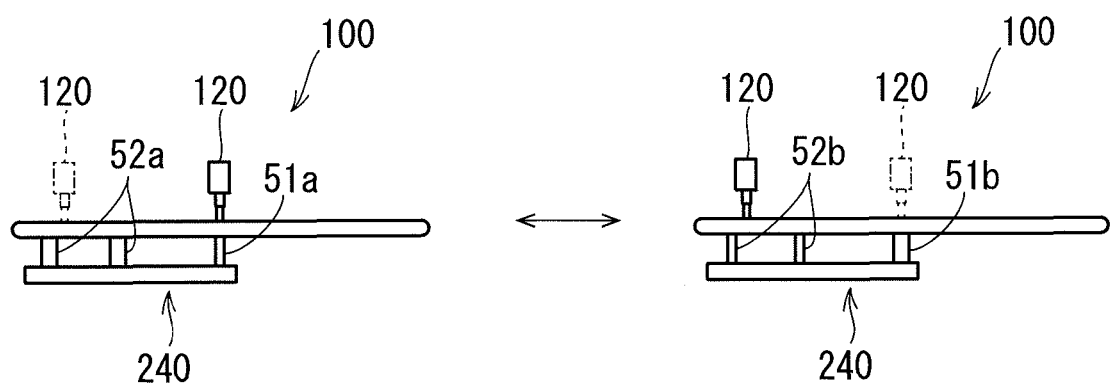
FIG. 10 schematically shows how the flow rates of the first liquid and second liquid are varied in accordance with the position of an upper nozzle that performs scanning.

FIG. 10 schematically shows how, in scanning of the position of the upper nozzle 120 (that is, the supply position of the treatment solution 53), the substrate treating apparatus 100 varies the flow rates of the liquid 51 (first liquid) and the liquid 52 (second liquid) in accordance with the position of the upper nozzle 120.

As described above, the nozzle rotation mechanism 155 can also operate as a scanning unit that causes the upper nozzle 120 of the treatment solution supply unit 303, which is discharging the treatment solution 53 to the upper surface S1 of the substrate W, to perform scanning above the upper surface S1 of the substrate W. In this case, the heat amount control unit 162 varies, in accordance with the position of the upper nozzle 120 of the treatment solution supply unit 303 that is scanned by the nozzle rotation mechanism 155, an amount of heat to be supplied to the substrate W by the first supply unit 301 and an amount of heat to be supplied to the substrate W by the second supply unit 302.

The flow rate control unit 163 of the heat amount control unit 162 more preferably varies a ratio between the flow rate of the liquid 51 and the flow rate of the liquid 52 in accordance with the position of the upper nozzle 120 that is scanned by the nozzle rotation mechanism 155, thereby varying a ratio between the amount of heat to be supplied to the substrate W by the first supply unit 301 and the amount of heat to be supplied to the substrate W by the second supply unit 302. In other words, the flow rate control unit 163 varies a ratio between the amounts of heat spatially as well as temporally. The flow rate can be varied with high responsivity, and accordingly, for high scanning rate of the upper nozzle 120, the temperature distribution of the substrate can be changed in a shorter period of time. The temperatures of the liquid 51 and the liquid 52 may be varied in accordance with the scanning position of the upper nozzle 120. In the example of FIG. 10, if the upper nozzle 120 is positioned above the central section of the substrate W, the flow rate control unit 163 increases the flow rate of the liquid 52 discharged to the intermediate section K2 and the peripheral section K3 of the lower surface S2 more than the flow rate of the liquid 51 discharged to the central section K1 of the lower surface S2 of the substrate W. The liquids 51 and 52 in this state are represented as liquids 51a and 52a, respectively. If the upper nozzle 120 is positioned above the peripheral section of the substrate W, the flow rate control unit 163 reduces the flow rate of the liquid 52 discharged to the intermediate section K2 and the peripheral section K3 more than the flow rate of the liquid 51 discharged to the central section K1. The liquids 51 and 52 in this state are represented as liquids 51b and 52b, respectively. This achieves, also in the scanning by the upper nozzle 120, the temperature distribution capable of reducing variations in treatment amount at the respective portions of the substrate W.

In the substrate treating apparatus according to the first embodiment configured as described above, the treatment solution 53 and the liquid 51 supplied to the upper surface and the lower surface, respectively, of the central section of the substrate W mainly contain the pure water 11 supplied from the common pure water supply source 131. The substrate treating apparatus can accordingly reduce a temperature difference between the treatment solution 53 and the liquid 51 to cause the central section of the substrate W to easily approach the temperature according to a desired treatment amount in the thickness direction of the substrate W. For equal treatment time of the respective portions of the substrate, the final treatment amount of each portion is proportional to the treatment amount at each portion per unit time. Additionally, the substrate treating apparatus supplies, through the rotation of the substrate W, the liquid 52 mainly containing the pure water 12 having a temperature higher than that of the pure water 11 to the peripheral section and the intermediate section of the substrate W in which temperature is more likely to drop in the central section, so that the temperature distribution in the radial direction of the substrate W can be uniformized easily. Further, if an obtained temperature distribution in the radial direction of the substrate W is not uniform, the substrate treating apparatus can independently control an amount of heat, which is supplied to the central section K1 of the lower surface S2 of the substrate W through the liquid 51, and an amount of heat, which is supplied to the intermediate section K2 and the peripheral section K3 of the lower surface S2 through the liquid 52, thereby changing the temperature distribution in the radial direction of the substrate W. This reduces a difference between a desired treatment amount and an actual treatment amount and variations in the treatment amount at the respective portions of the substrate W through control of the amounts of heat supplied from two systems, namely, a supply system of the liquid 51 and a supply system of the liquid 52, at low cost. The treatment amount in the central section of the substrate W can be made uniform independently of the treatment conditions. The amount of heat to be supplied to the peripheral section and the intermediate section through the liquid 52 is adjusted based on the amount of heat to be supplied to the central section of the substrate W through the liquid 51, so that the conditions for controlling an amount of heat corresponding to a desired treatment amount can be obtained easily.

In the substrate treating apparatus according to the first embodiment configured as described above, the pure water 11a and the pure water 11b are divided from the pure water 11 at a branching point at which the pipe 383 located at some midpoint in the conduit 382 guided by the pure water supply source 131 is branched off. If a long path from the pure water supply source 131 to the branching portion increases a temperature decrease amount of the pure water 11, a temperature difference between the pure water 11a supplied to the first supply unit 301 and the pure water 11b supplied to the second supply unit 302 is reduced. This further reduces a temperature difference between the treatment solution 53 and the liquid 51, causing the central section of the substrate W to more easily approach the temperature according to a desired treatment amount in the thickness direction of the substrate W.

The substrate treating apparatus according to the first embodiment configured as described above mixes the pure water 11b and the liquid 14 having the same temperature as that of the chemical solution 13 such that a mixing ratio between the pure water 11a and the chemical solution 13 in the treatment solution 53 is equal to a mixing ratio between the pure water 11b and the liquid 14 for temperature adjustment in the liquid 51, thereby preparing the liquid 51. Thus, a temperature difference between the treatment solution 53 and the liquid 51 can be reduced independently of whether the mixing ratios are large or small.

The substrate treating apparatus according to the first embodiment configured as described above varies a ratio between an amount of heat to be supplied to the central section K1 of the lower surface S2 of the substrate W and an amount of heat to be supplied to the peripheral section K3 and the intermediate section K2 of the lower surface S2, in accordance with the supply position of the treatment solution 53 that is scanned on the upper surface S1 of the substrate W. This allows the temperature distribution in the radial direction of the substrate W to further approach the temperature distribution required in accordance with the supply position of the treatment solution 53. Thus, also in scanning of the supply position of the treatment solution 53, variations in treatment amount at the respective portions of the substrate W can be reduced further.

The substrate treating apparatus according to the first embodiment configured as described above varies a ratio between the flow rate of the liquid 51 and the flow rate of the liquid 52 in accordance with the scanned supply position of the treatment solution 53. These flow rates can be changed rapidly, increasing the responsivity of fluctuations in temperature distribution in the radial direction of the substrate W with respect to the variations in the supply position of the treatment solution 53, further reducing variations in treatment amount at the respective portions of the substrate W.

2. Second Embodiment 2-1. Configuration of Substrate Treating Apparatus

Figure 11:
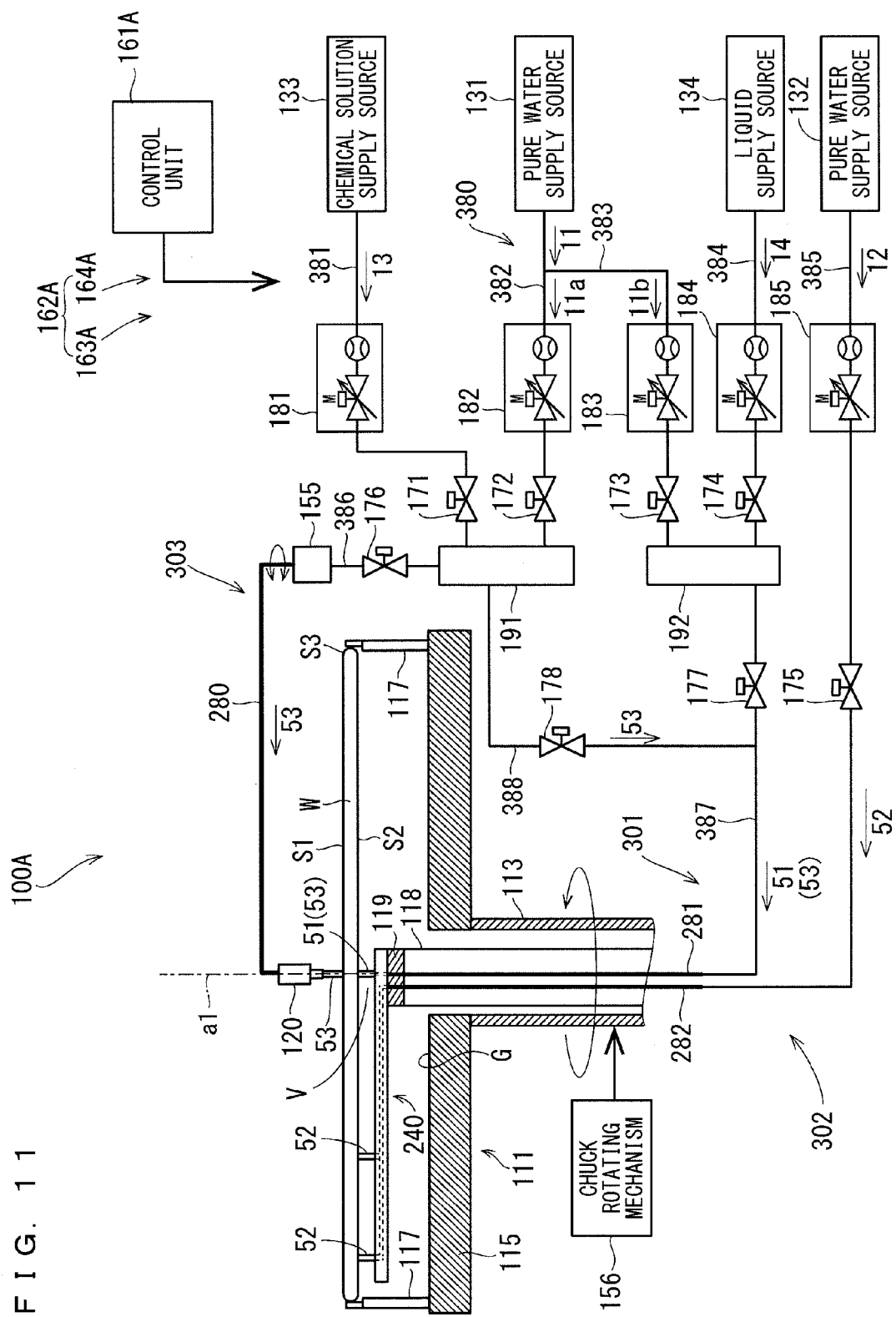
FIG. 11 schematically shows an example schematic configuration of a substrate treating apparatus according to a second embodiment of the present invention.

FIG. 11 schematically shows an example schematic configuration of a substrate treating apparatus 100A according to a second embodiment. The substrate treating apparatus 100A has a configuration similar to that of the substrate treating apparatus 100 except for that the apparatus 100A includes a control unit 161A, a heat amount control unit 162A, a flow rate control unit 163A, and a temperature control unit 164A in place of the control unit 161, the heat amount control unit 162, the flow rate control unit 163, and the temperature control unit 164 of the substrate treating apparatus 100 and that the apparatus 100A further includes a pipe 388 and an open/close valve 178. Thus, the configuration of the substrate treating apparatus 100A different from that of the substrate treating apparatus 100 is described. Description of the similar configuration is partially or entirely omitted unless it is referred to in the description of a different configuration.

The substrate treating apparatus 100A treats a substrate with a treatment solution containing a chemical solution ("chemical solution treatment"). Specifically, the substrate treating apparatus 100A etches an upper surface (also referred to as a "front surface") S1 of a substrate W such as a semiconductor wafer using an etching solution as a treatment solution, thereby removing a thin film (waste material) formed on the upper surface S1. The treatment solution may be, for example, a cleaning solution. A lower surface S2 opposite the upper surface S1 is also referred to as a "rear surface." The front surface of the substrate W has a substantially circular shape, and the upper surface 51 of the substrate W is a device forming surface on which a device pattern is formed. The substrate treating apparatus 100A can perform the rinsing treatment for the substrate W, the cleaning treatment for the lower nozzle 240 described below, and the treatment of draining off the liquids adhering to the substrate W and the lower nozzle 240 through rotation of the substrate W described below after the chemical solution treatment.

To the upper end of the rotating spindle 113, a disc-shaped spin base 115 is integrally connected using a fastening component such as a screw. Thus, the operation of the chuck rotating mechanism 156 in response to a motion command from the control unit 161A that controls the entire apparatus causes the rotating spindle 113 and the spin base 115 to integrally rotate about a rotation axis a1. The control unit 161A also controls the chuck rotating mechanism 156 to adjust a rotational speed. The control unit 161A is enabled by, for example, a CPU executing a program stored in a memory.

It suffices that the discharge port 241 of the lower nozzle 240 is provided so as to discharge the liquid 51 to the central section K1, where the central axis of the discharge port 241 is not required to coincide with the rotation axis a1 of the substrate W. A plurality of discharge ports 241 may be provided. Or, any one of the discharge ports 242 and 243 may be provided, or, at least one discharge port that discharges the liquid 52 to the lower surface S2 of the substrate W may be provided in the flow path 247 in addition to the discharge port 242 and the discharge port 243. Or, two separately formed lower nozzles may be used in place of the lower nozzle 240 such that the discharge port 241, the inlet 244, and the flow path 246 are provided in one of the lower nozzles and the discharge port 242, the discharge port 243, the inlet 245, and the flow path 247 are provided in the other lower nozzle. Or, no draining part 249 may be formed.

The substrate treating apparatus 100A discharges the liquids 51 and 52 to the lower surface S2 from the lower nozzle 240 while rotatably driving the spin chuck 111 holding the substrate W as described above by the chuck rotating mechanism 156 to rotate the substrate W at a predetermined rotational speed, thereby adjusting the temperature of the substrate W. Then, the substrate treating apparatus 100A supplies the treatment solution 53 to the upper surface S1 of the substrate from an upper nozzle 120 described below, thereby performing a predetermined treatment (such as an etching treatment) on the substrate W.

At the side of the substrate W held by the spin chuck 111, a nozzle rotation mechanism 155 including a motor is provided. The control unit 161A controls the operation of the nozzle rotation mechanism 155. Attached to the nozzle rotation mechanism 155 is a tube-shaped, stiff piping arm 280 that can turn about the nozzle rotation mechanism 155 in a substantially horizontal plane.

One end of the piping arm 280 penetrates the nozzle rotation mechanism 155 to the lower surface thereof, and the other end can be positioned above the central section of the upper surface S1 of the substrate W by the piping arm 280 being turned by the nozzle rotation mechanism 155. The upper nozzle 120 is attached to the other end. When, for example, the substrate W is passed to the spin base 115, the piping arm 280 is turned so that the upper nozzle 120 is retracted from the transport path of the substrate W. In the etching treatment, the rinsing treatment, or other treatment, the position (treatment position) of the upper nozzle 120 is accurately adjusted to be located above the central section of the upper surface S1 through servocontrol. Here, the control unit 161 performs the servocontrol. This enables the adjustment of the position of the upper nozzle 120 in response to a command from the control unit 161A.

The control unit 161A controls the calorific value of each heater such that the temperature of the liquid detected by each temperature sensor reaches a target temperature, thereby controlling the temperatures of the pure water 11, the pure water 12, the chemical solution 13, and the liquid 14 supplied by the pure water supply sources 131 and 132, the chemical solution supply source 133, and the liquid supply source 134, respectively.

More specifically, in the chemical solution treatment for the substrate W with the treatment solution 53, the control unit 161A controls the respective heaters on the basis of the temperatures detected by the temperature sensors of the pure water supply sources 131 and 132 to set the temperature of the pure water 11 supplied by the pure water supply source 131 to a first temperature and also set the temperature of the pure water 12 supplied by the pure water supply source 132 to a second temperature higher than the first temperature.

The control unit 161A can freely control the first temperature and the second temperature within a predetermined temperature range in accordance with the predetermined setting information. The control unit 161A, the temperature sensor and the heater of the pure water supply source 131, and the temperature sensor and the heater of the pure water supply source 132 constitute a temperature control unit 164A capable of freely controlling the first temperature of the pure water 11 and the second temperature of the pure water 12 within a predetermined temperature range. In other words, the temperature control unit 164A performs temperature control of controlling the temperature (first temperature) of the pure water 11 in the pure water supply source 131 and the temperature (second temperature) of the pure water 12 in the pure water supply source 132. When the substrate treating apparatus 100A performs the treatment other than the chemical solution treatment such as the rinsing treatment, the heat amount control unit 162A may perform temperature control such that the liquid 51 and the liquid 52 have the same temperature or may perform temperature control such that the liquid 51 has a temperature higher than that of the liquid 52.

The control unit 161A can freely control the temperatures of the chemical solution 13 and the liquid 14 within a predetermined temperature range in accordance with the predetermined setting information by controlling the heaters contained in the chemical solution supply source 133 and the liquid supply source 134. The control unit 161A preferably controls the temperature of the liquid 14 and the temperature of the chemical solution 13 (in the case where the chemical solution supply source 133 supplies a plurality of chemical solutions as the chemical solution 13, the temperature of each chemical solution) to be the same temperature.

The mixing unit 191 of the substrate treating apparatus 100A is connected with the lower end of the supply tube 281 by a pipe 388 that is connected at some midpoint in a pipe 387 and the pipe 387. At some midpoint in the pipe 388 is provided an open/close valve 178.

Each of the flow rate controllers 181 to 185 includes, for example, a flowmeter that detects the flow rate of a liquid flowing through the pipe thereof and a variable valve capable of adjusting the flow rate of the liquid in accordance with a valve open/close amount. The control unit 161A controls, for the flow rate controllers 181 to 185, the open/close amounts of the variable valves of the flow rate controllers 181 to 185 via a valve control mechanism (not shown) such that the flow rates detected by the flowmeters reach target flow rates. The control unit 161A sets target flow rates within a predetermined range in accordance with the predetermined setting information, thereby freely controlling the flow rates of the liquids passing through the flow rate controllers 181 to 185 in accordance with the predetermined setting information. The control unit 161A controls the open/close valves 171 to 178 to be opened or closed via the valve control mechanism.

The control unit 161A controls the flow rate of the chemical solution 13 passing through the flow rate controller 181 within a predetermined range and also controls the open/close valve 171 to be opened, so that the chemical solution 13 is supplied to the mixing unit 191. The control unit 161A controls the flow rate of the pure water 11a passing through the flow rate controller 182 within a predetermined range and also controls the open/close valve 172 to be opened, so that the pure water 11a is supplied to the mixing unit 191.

The control unit 161A controls the flow rate controllers 181 and 182 such that the flow rate of the pure water 11a passing through the flow rate controller 182 and the flow rate of the chemical solution 13 passing through the flow rate controller 181 (in the case where the chemical solution 13 includes a plurality of chemical solutions, each flow rate of each chemical solution) have a predetermined flow rate ratio. At this flow rate, the flow rate of the pure water 11a is higher than the flow rate of the chemical solution 13. For example, in the case where ammonium hydroxide, hydrogen peroxide, and pure water are mixed to prepare an SC-1 liquid as the treatment solution 53, ammonium hydroxide, hydrogen peroxide, and pure water (pure water 11a) are supplied to the mixing unit 191 at a flow rate ratio of 1:4:20. The control unit 161A can change the flow rate ratio in accordance with the predetermined setting information in accordance with, for example, the type and temperature of the chemical solution 13.

The pure water 11a and the chemical solution 13 supplied to the mixing unit 191 are mixed by the mixing unit 191 at a mixing ratio equal to the flow rate ratio between the pure water 11a and the chemical solution 13, so that the treatment solution 53 is prepared. The control unit 161A controls the open/close valve 176 to be opened, so that the treatment solution 53 is supplied from the mixing unit 191 to the upper nozzle 120 through the pipe 386 and the piping arm 280 and is discharged from the discharge port of the upper nozzle 120 to the central section of the upper surface S1 of the substrate W. The control unit 161A controls the open/close valve 178 to be opened, so that the treatment solution 53 is introduced, through the inlet 244, from the mixing unit 191 to the flow path 246 of the lower nozzle 240 via the pipe 388, the pipe 387, and the supply tube 281, and is discharged to the central section K1 of the lower surface S2 of the substrate W from the discharge port 241. The control unit 161A selectively controls the open/close valve 177 and the open/close valve 178 to be opened.

The mixing unit 191, the pipe 386, the open/close valve 176, the nozzle rotation mechanism 155, the piping arm 280, and the upper nozzle 120 constitute a treatment solution supply unit 303. In other words, the treatment solution supply unit 303 is supplied with the pure water 11a from the pipe 382 of the pipe system 380 and supplies the upper surface S1 of the substrate W with a treatment solution 53 containing the pure water 11a and the chemical solution 13 mixed so as to mainly contain the pure water 11a.

The control unit 161A controls the flow rate of the pure water 11b passing through the flow rate controller 183 within a predetermined range and also controls the open/close valve 173 to be opened, whereby the pure water 11b is supplied to the mixing unit 192. The control unit 161A controls the flow rate of the liquid 14 passing through the flow rate controller 184 within a predetermined range and also controls the open/close valve 174 to be opened, whereby the liquid 14 is supplied to the mixing unit 192. The control unit 161A controls the flow rate controllers 183 and 184 such that the flow rate of the pure water 11b and the flow rate of the liquid 14 have a predetermined flow rate ratio. This flow rate ratio is a flow rate ratio at which the flow rate of the pure water 11b is higher than the flow rate of the liquid 14. The control unit 161A can also change the flow rate ratio in accordance with the predetermined setting information.

The control unit 161A can control the flow rate controllers 183 and 184 such that the flow rates of the pure water 11b and the liquid 14 vary while keeping the flow rate ratio between the pure water 11b and the liquid 14. The control unit 161A can also control the flow rate controllers 183 and 184 such that the flow rates of the pure water 11b and the liquid 14 vary with the varying flow rate ratio.

When the chemical solution 13 and the liquid 14 have the same temperature, the control unit 161A preferably controls the flow rate ratio between the pure water 11b and the liquid 14 such that the flow rate ratio between the pure water 11b and the liquid 14 that are supplied to the mixing unit 192 is equal to the flow rate ratio between the pure water 11a and the chemical solution 13 that are supplied to the mixing unit 192.

The pure water 11b and the liquid 14 that are supplied to the mixing unit 192 are mixed at a mixing ratio equal to the flow rate ratio between the pure water 11b and the liquid 14 by the mixing unit 192, so that the liquid 51 is prepared. The control unit 161A controls the open/close valve 177 to be opened, so that the liquid 51 is introduced, through the inlet 244, from the mixing unit 192 to the flow path 246 of the lower nozzle 240 via the pipe 387 and the supply tube 281, and is discharged from the discharge port 241 to the central section K1 of the lower surface S2 of the substrate W. The open/close valve 177 and the open/close valve 178 are selectively controlled to be opened. This allows the liquid 51 and the treatment solution 53 to be selectively discharged to the central section K1 from the discharge port 241.

The mixing unit 192, the pipe 387, the open/close valve 177, the supply tube 281, and the flow path 246 and the discharge port 241 of the lower nozzle 240 constitute a first supply unit 301. In other words, the first supply unit 301 is supplied with the pure water 11b from the pipe 383 of the pipe system 380 and supplies the central section K1 of the lower surface S2 of the substrate W with the liquid 51 mainly containing the pure water 11b. The first supply unit 301 preferably mixes the pure water 11b and the liquid 14 for temperature adjustment, which has the same temperature as that of the chemical solution 13, such that the mixing ratio between the pure water 11a and the chemical solution 13 in the treatment solution 53 is equal to the mixing ratio between the pure water 11b and the liquid 14 in the liquid 51, thereby preparing the liquid 51. This further reduces a temperature difference between the liquid 51 and the treatment solution 53.

The control unit 161A controls the flow rate of the pure water 12 passing through the flow rate controller 185 within a predetermined range and controls the open/close valve 175 to be opened, whereby the pure water 12 as the liquid 52 is supplied from the pure water supply source 132 to the supply tube 282 through the pipe 385. Then, the liquid 52 is introduced into the flow path 247 of the lower nozzle 240 from the inlet 245 connected with the supply tube 282 and is discharged to the intermediate section K2 and the peripheral section K3 of the lower surface S2 of the substrate W from the discharge ports 242 and 243. An additional mixing unit such as a mixing valve may be provided at some midpoint in the path of the pipe 385. Also, an additional chemical solution may be supplied to the additional mixing unit at a flow rate lower than the flow rate of the pure water 12 supplied to the additional mixing unit, and the pure water 12 may be mixed with the chemical solution, whereby the liquid 52 is prepared. In other words, the liquid 52 may be the pure water 12 per se or a liquid containing the pure water 12 and the chemical solution mixed so as to mainly contain the pure water 12. The pure water 12 per se is a liquid mainly containing the pure water 12.

The pipe 385, the flow rate controller 185, the open/close valve 175, the supply tube 282, and the flow path 247 and the discharge ports 242 and 243 of the lower nozzle 240 constitute a second supply unit 302. In other words, the second supply unit 302 supplies the liquid 52 mainly containing the pure water 12 supplied from the pure water supply source 132 to the peripheral section K3 of the lower surface S2 of the substrate W and to the intermediate section K2 of the lower surface S2 between the peripheral section K3 and the central section K1.

The control unit 161A and the flow rate controllers 183 to 185 constitute a flow rate control unit 163A. The flow rate control unit 163A independently controls the flow rate of the liquid 51 at which the pure water 11b and the liquid 14 are mixed by the mixing unit 192 and the flow rate of the liquid 52 (pure water 12), thereby independently controlling an amount of heat to be supplied to the substrate W by the first supply unit 301 and an amount of heat to be supplied to the substrate W by the second supply unit 302 such that the temperature distribution in the radial direction of the substrate W is changeable.

The temperature control unit 164A described above independently controls the temperature (first temperature) of the pure water 11 in the pure water supply source 131 and the temperature (second temperature) of the pure water 12 in the pure water supply source 132, thereby independently controlling an amount of heat to be supplied to the substrate W by the first supply unit and an amount of heat to be supplied to the substrate W by the second supply unit 302 such that the temperature distribution in the radial direction of the substrate W is changeable.

The flow rate control unit 163A and the temperature control unit 164A constitute a heat amount control unit 162A. The heat amount control unit 162A can thus independently control an amount of heat to be supplied to the substrate W by the first supply unit and an amount of heat to be supplied to the substrate W by the second supply unit 302 such that the temperature distribution in the radial direction of the substrate W is changeable.

Of the components of the substrate treating apparatus 100A, for example, the components other than the pure water supply sources 131 and 132, the chemical solution supply source 133, and the liquid supply source 134 are housed in a common housing whereas the pure water supply sources 131 and 132, the chemical solution supply source 133, and the liquid supply source 134 are installed on, for example, a floor other than the floor on which an installation room is installed. In this case, the branching portion of the pipe system 380, at which the pipe 383 is branched off from the pipe 382, is preferably housed in the housing. The pure water supply sources 131 and 132, the chemical solution supply source 133, and the liquid supply source 134 may also be housed in the housing.

The substrate treating apparatus 100A concurrently rotates the substrate W by the spin chuck 111, supplies the liquid 51 to the central section K1 of the lower surface S2 of the substrate W by the first supply unit 301, supplies the liquid 52 to the intermediate section K2 and the peripheral section K3 of the lower surface S2 by the second supply unit 302, and supplies the treatment solution 53 to the upper surface S1 of the substrate W by the treatment solution supply unit 303. The substrate treating apparatus 100A causes the open/close valve 177 to be opened and the open/close valves 175 and 178 to be closed, thereby supplying only the liquid 51 out of the liquid 51 and the liquid 52 to the lower surface S2 (more accurately, the central section K1 of the lower surface S2) of the substrate W. Also, the substrate treating apparatus 100A causes the open/close valve 178 to be opened and the open/close valves 175 and 177 to be closed, thereby supplying only the treatment solution 53 to the central section K1. Alternatively, the pure water supply source 131 and, for example, a heater that heats the pure water 11 supplied by the pure water supply source 131 to the second temperature may constitute the pure water supply source 132. Still alternatively, the pure water supply source 132 and the mixing unit, which prepares the pure water having the first temperature by mixing pure water having a temperature lower than the first temperature into the pure water 12 supplied by the pure water supply source 132, may constitute the pure water supply source 131.

2-2. Operation of Substrate Treating Apparatus

Figure 26:
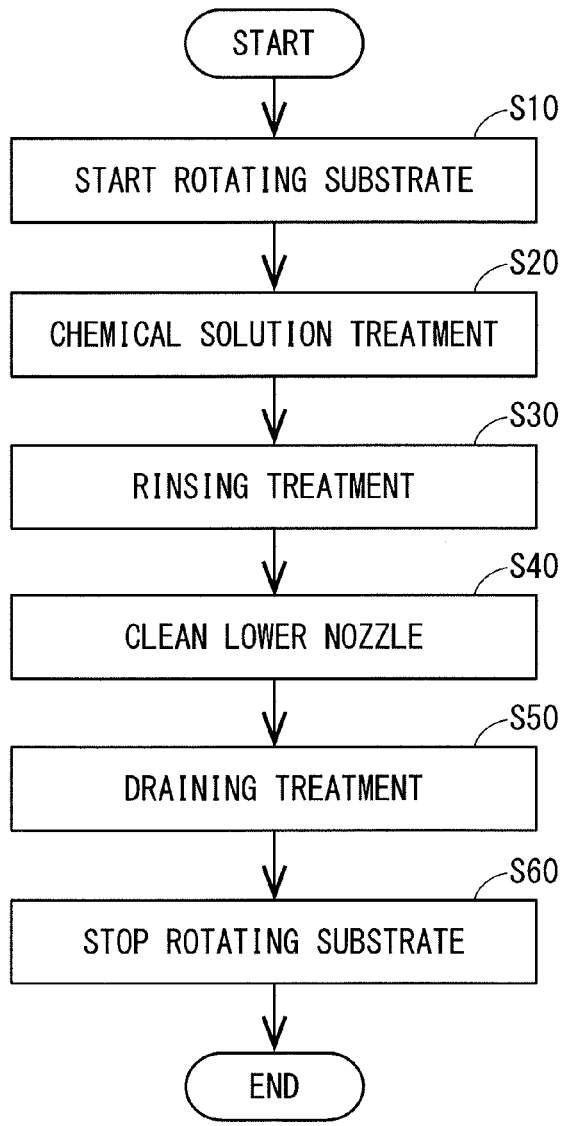
FIG. 26 is a flowchart showing an example operation of the substrate treating apparatus according to the second embodiment of the present invention.

FIG. 26 is a flowchart showing an example operation of the substrate treating apparatus 100A. The operation of the substrate treating apparatus 100A is described with reference to the flowchart of FIG. 26 by referring to FIGS. 12 to 18 as appropriate.

<2-2-1. Starting Rotation of Substrate>

When treating the substrate W with the treatment solution 53 containing the chemical solution 13 stored in the chemical solution supply source 133 (chemical solution treatment), the substrate treating apparatus 100A first drives the chuck rotating mechanism 156 to rotate the spin chuck 111 holding the substrate W, to thereby start rotating the substrate W (Step S10 of FIG. 26).

<2-2-2. Chemical Solution Treatment>

The substrate treating apparatus 100A supplies the treatment solution 53 to the substrate W with the substrate W rotating, thereby performing the chemical solution treatment on the substrate W with the treatment solution 53 (Step S20 of FIG. 26). Specifically, the substrate treating apparatus 100A supplies the treatment solution 53 to the upper surface 51 of the substrate W from the upper nozzle 120 while, for example, supplying the liquid 51 and the liquid 52 to the lower surface S2 from the lower nozzle 240 to adjust the temperature distribution of the substrate W, thereby performing the chemical solution treatment on the upper surface S1. The temperatures and the flow rates of the liquids 51 and 52, supplied to the lower surface S2 of the substrate W concurrently with the chemical solution treatment, are set based on the predetermined setting information in accordance with the type of a film to be treated which is formed on the substrate W, the temperature and the type of the treatment solution 53, and the manner of supply, such as the presence or absence of scanning. The setting information is set such that variations in treatment amount of the substrate W in the radial direction of the substrate W are reduced and that a deviation of the treatment amount to a target treatment amount is reduced. The substrate treating apparatus 100A can perform the chemical solution treatment on the upper surface S1 and the lower surface S2 by supplying the treatment solution 53 to the upper surface S1 of the substrate W from the upper nozzle 120 while supplying the treatment solution 53 to the central section K1 of the lower surface S2 of the substrate W and supplying the liquid 52 to the intermediate section K2 and the peripheral section K3 from the lower nozzle 240. The substrate treating apparatus 100A can perform only the chemical solution treatment on the lower surface S2 out of the upper surface S1 and the lower surface S2. The substrate treating apparatus 100A can sequentially perform the chemical solution treatment for the upper surface S1 and the chemical solution treatment for the lower surface S2. The rotational speed of the substrate W during the chemical solution treatment is set to, for example, 300 rpm. The treatment time is set to, for example, 30 seconds.

<2-2-3. Rinsing Treatment>

After the completion of the chemical solution treatment, the substrate treating apparatus 100A performs the rinsing treatment for the substrate W (Step S30 of FIG. 26). In the rinsing treatment for the upper surface S1, for example, a rinse solution such as pure water set to 24° C. is discharged to the upper surface S1 from a nozzle (not shown) provided next to the upper nozzle 120. In the rinsing treatment for the lower surface S2, for example, the liquid 51 and the liquid 52 that have been prepared based on the pure water and have temperatures adjusted to 24° C. are discharged as a rinse solution to the lower surface S2 from the lower nozzle 240. The rinse solution may be, for example, pure water, ozone water, magnetic water, regenerated water (hydrogen water), various organic solvents (ionized water or isopropyl alcohol (IPA)), or functional water. The rinsing treatment for the upper surface S1 and the rinsing treatment for the lower surface S2 may be performed concurrently or sequentially. In the case where the treatment solution 53 is supplied to the lower surface S2 in the chemical solution treatment, it is preferable that the rinsing treatment be necessarily performed on the lower surface S2. Also in the case where the treatment solution 53 is not supplied to the lower surface S2, the rinsing treatment for the lower surface S2 may be performed. The rotational speed of the substrate W during the rinsing treatment is set to, for example, 1200 rpm, and the rinsing treatment time is set to, for example, 10 to 15 seconds.

<2-2-4. Cleaning Treatment for Lower Nozzle>

After the completion of the rinsing treatment, the substrate treating apparatus 100A performs the cleaning treatment on the lower nozzle 240 (Step S40 of FIG. 26). In the case where the treatment solution 53 is discharged to the lower surface S2 in the chemical solution treatment, it is preferable that the cleaning treatment be necessarily performed on the lower nozzle 240. In the cleaning treatment for the lower nozzle 240, the substrate treating apparatus 100A causes the rotational speed of the substrate W to be lower than the rotational speed during the rinsing treatment (more accurately, the rotational speed during the chemical solution treatment). The substrate treating apparatus 100A sets, through control by the flow rate control unit 163A, the flow rate of the liquid 51 serving as the rinse solution to be supplied to the central section K1 to the first flow rate, and the flow rate of the liquid 52 serving as the rinse solution to be supplied to the edge area to the second flow rate higher than the first flow rate. It is preferable to supply the rinse solution also to the upper surface S1 concurrently with the cleaning treatment for the lower nozzle 240. Although the cleaning treatment for the lower nozzle may be performed with the substrate W not rotating, to prevent or reduce uneven cleaning of the lower surface S2 of the substrate W, the cleaning treatment for the lower nozzle is preferably performed with the substrate W rotating at a low speed, for example, 10 rpm.

First, the substrate treating apparatus 100A sets the first flow rate, the second flow rate, and the flow rate at which the rinse solution is supplied to the upper surface S1 to, for example, 400 ml/min, 1200 ml/min, and 2000 ml/min, respectively, and then performs the cleaning treatment on the lower nozzle 240 for three seconds. Then, the substrate treating apparatus 100A sets the first flow rate, the second flow rate, and the flow rate at which the rinse solution is supplied to the upper surface S1 to, for example, 800 ml/min, 1200 ml/min, and 2000 ml/min, respectively, and performs the cleaning treatment on the lower nozzle 240 for another three seconds.

Figure 12:
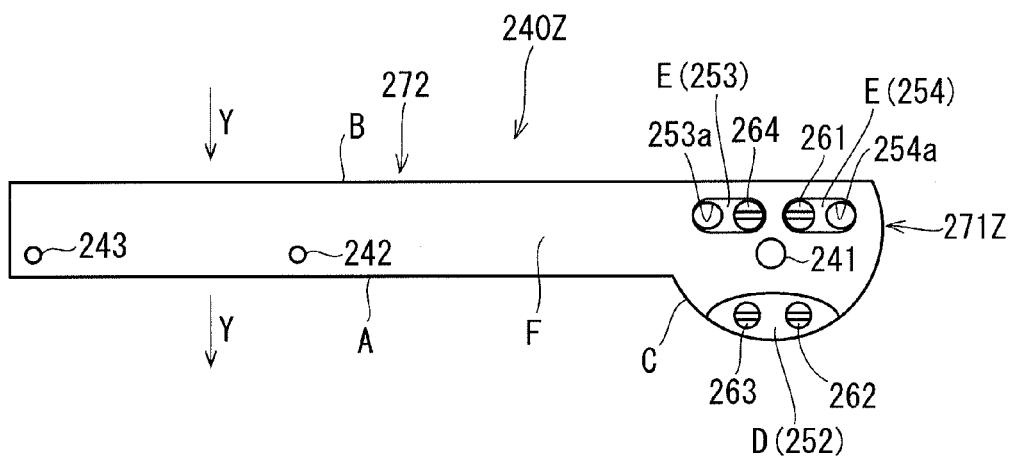
FIG. 12 schematically shows a plurality of places at which the presence or absence of a chemical solution remaining after a cleaning treatment for a lower nozzle is checked.

FIG. 12 schematically shows a plurality of places A to G at which the presence or absence of a remaining chemical solution after the cleaning treatment for a lower nozzle 240Z is checked. The lower nozzle 240Z has a configuration similar to that of the lower nozzle 240 except for that it has a counterbore 254 in place of the counterbore 251 of the lower nozzle 240. The lower nozzle 240Z has a one-side portion (proximal portion) 271Z facing the central section K1 of the lower surface S2 of the substrate W and an extended portion 272 extended from the one-side portion 271Z to below the peripheral section K3 of the lower surface S2 along the radial direction of the substrate W. Although the counterbore 251 is open to the upper surface and the one-end lateral surface of the one-side portion 271Z, similarly to the counterbore 253, the counterbore 254 is open to, out of the upper surface and the one-end lateral surface of the one-side portion 271Z, only the upper surface. Thus, in the bottom of the counterbore 254, a drain hole 254a is formed which has a configuration similar to that of the drain hole 253a of the counterbore 253. The drain hole 254a is open to a portion of the lower surface of the lower nozzle 240Z, which does not face the pedestal 119.

The place A shown in FIG. 12 is a lateral surface of the extended portion 272 of the lower nozzle 240Z, which is downstream in the direction of rotation of the substrate W, and the place B is a lateral surface of the one-side portion 271Z and the extended portion 272 of the lower nozzle 240Z, which is upstream in the direction of rotation. The place C is a lateral surface of the one-side portion 271Z, which is downstream in the direction of rotation of the substrate W. The place D is a recessed surface of the counterbore 252, and the places E are the recessed surfaces of the counterbores 253 and 254. The place F is an upper surface of the lower nozzle 240Z. The place G is an upper surface of the spin base 115 (see FIG. 11). The presence or absence of a remaining chemical solution at the places A to G is described below with reference to FIGS. 15 to 18.

Figure 13:
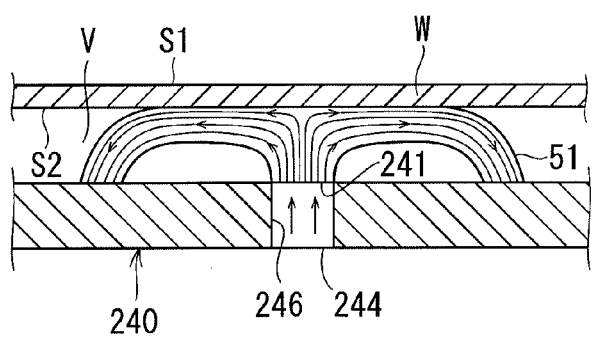
FIG. 13 is a cross-sectional view schematically showing an example of how a liquid discharged from the lower nozzle to the lower surface of the substrate spreads.

FIG. 13 is a cross-sectional view schematically showing an example of how a liquid discharged from the lower nozzle 240 to the lower surface S2 of the substrate W spreads. FIG. 13 illustrates the case in which the liquid 51 is discharged from the discharge port 241 of the lower nozzle 240 to the central section K1.

As shown in FIG. 13, the liquid 51 discharged from the discharge port 241 toward the lower surface S2 of the substrate W impinges upon the lower surface S2, and then, spreads along the lower surface S2 in a space V between the upper surface of the lower nozzle 240 of the lower surface S2 and the lower surface S2. Subsequently, the liquid 51 is supplied to the upper surface of the lower nozzle 240 from the lower surface S2 of the substrate W. The liquid 51 discharged to the lower surface S2 spreads farther along the lower surface S2 of the substrate W with a higher flow rate. The spacing between the lower surface S2 and the upper surface of the lower nozzle 240 is, for example, 1.5 mm. In the example of FIG. 13, the portion to which no liquid 51 is supplied is below the space V, more accurately, below the liquid 51. If a chemical solution is present in this portion, the chemical solution, which is not replaced by the liquid 51, remains in the lower nozzle 240.

Therefore, the substrate treating apparatus 100A discharges the liquid 51 serving as the rinse solution from the discharge port 241 to the central section K1 of the lower surface S2 at the first flow rate and also discharges the liquid 52 serving as the rinse solution from the discharge ports 242 and 243 to the intermediate section K2 and the peripheral section K3 of the lower surface S2 at the second flow rate higher than the first flow rate. Although the discharge ports 242 and 243 have a greater distance from the one-side portion 271 of the lower nozzle 240 than the discharge port 241, the second flow rate is higher than the first flow rate. Thus, the liquid 51, which is discharged from the discharge port 241 and spreads along the lower surface S2 of the substrate W, and the liquid 52, which is discharged from the discharge ports 242 and 243 and spreads along the lower surface S2 of the substrate W, collide with each other in the portion of the lower surface S2 of the substrate W, which is above or near the one-side portion 271 of the lower nozzle 240 even if flow rates of the liquids are increased sufficiently, so that the liquids 51 and 52 fall to the lower nozzle together. This allows much of the liquids 51 and 52 to be supplied to the one-side portion 271. Thus, the chemical solution remaining in the one-side portion 271 can be sufficiently replaced with the liquids 51 and 52 to clean the one-side portion 271. The chemical solution remaining in the one-side portion 271 can be accordingly prevented or reduced.

The second flow rate is a flow rate at which the liquid 52 discharged from the peripheral discharge ports (discharge ports 242 and 243) of the lower nozzle 240 can be supplied to the one-side portion 271 through the edge area. The first flow rate and the second flow rate, which are determined in advance through experiments or the like, are stored in, for example, the memory of the control unit 161A.

The substrate treating apparatus 100A preferably cleans the one-side portion 271 while bringing the space V between the horizontal surface at the one-side portion 271 of the lower nozzle 240 and the lower surface S2 of the substrate W into a liquid-fluid state in which the space V is filled with a liquid containing the liquids 51 and 52 (specifically, a liquid containing the chemical solution 13 and the liquids 51 and 52) discharged from the lower nozzle 240.

Figure 14:
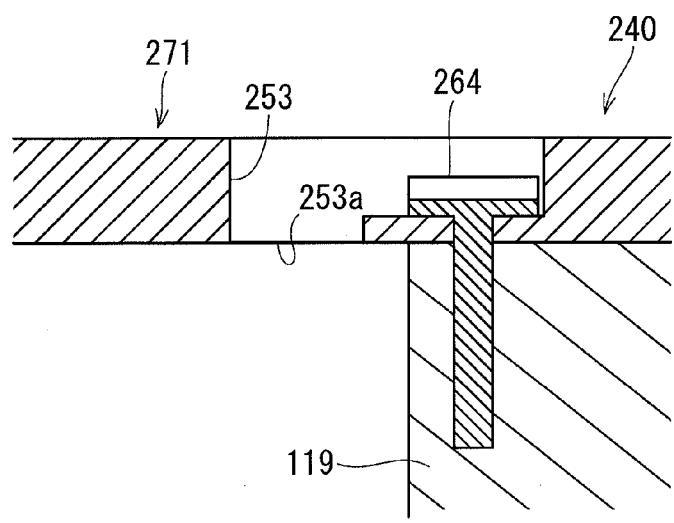
FIG. 14 is a cross-sectional view schematically showing a counterbore and a drain hole that are provided in the lower nozzle.

FIG. 14 is a cross-sectional view schematically showing the counterbore 253 and the drain hole 253a provided in the lower nozzle 240. As shown in FIG. 14, the counterbore 253 for accommodating the screw 264 that fixes the one-side portion 271 to the pedestal 119 is formed in the one-side portion 271 of the lower nozzle 240. As described above, the counterbore 253 is open to, out of the upper surface and the lateral surface of the one-side portion 271, only the upper surface. Thus, the drain hole 253a vertically penetrating the one-side portion 271 is formed in the bottom of the counterbore 253. As described above, the drain hole 253a is open to the portion of the lower surface of the lower nozzle 240, which does not face the pedestal 119. In the cleaning treatment for the lower nozzle 240, the substrate treating apparatus 100A drains the chemical solution adhering to the one-side portion 271 to the outside of the lower nozzle 240 from the drain hole 253a together with the liquid 51 and the liquid 52 supplied to the one-side portion 271. A drain hole similar to the drain hole 253a may be provided at the part of the one-side portion 271 other than the counterbore 253.

FIGS. 15 to 18 are tables showing the results of checking the presence or absence of a remaining chemical solution at the plurality of places A to G shown in FIG. 12. In the examples of FIGS. 15 to 18, measurements were performed three times and, for each of the places A to G, "OK" is marked when no remaining chemical solution is detected or "NG" is marked when a remaining chemical solution is found. In any of the tables of FIGS. 15 to 18, the flow rate of pure water from the discharge port 241 in the cleaning treatment for the lower nozzle 240Z is set to 400 ml/min. The flow rates of the pure water discharged from the discharge ports 242 and 243 are set to no discharge, 400 ml/min, 800 ml/min, and 1200 ml/min, respectively, in FIGS. 15 to 18.

The results shown in FIGS. 15 to 18 reveal that a larger amount of remaining chemical solution after the cleaning treatment for the lower nozzle 240Z is present in the recessed counterbore 252 (place D), counterbore 253 (place E), and counterbore 254 (place F) than in the flat places A to C, F, and G. The results also reveal that a remaining chemical solution is more likely to be removed in the counterbore 252, which is open not only to the upper surface of the lower nozzle 240Z but also to the lateral surface thereof, than in the counterbores 253 and 254 that are not open.

It is also revealed that although the drain holes 253a and 254a are provided in the counterbores 253 and 254, respectively, a chemical solution is the most resistant to being removed from these counterbores among the places A to G. This reveals that in order to remove a remaining chemical solution to such an extent that it is not detected in the counterbores 253 and 254 when the pure water is discharged from the discharge port 241 at 400 ml/min, pure water needs to be discharged from each of the discharge ports 242 and 243 at a flow rate of 1200 ml/min.

<2-2-5. Draining Treatment>

After the completion of the cleaning treatment for the lower nozzle 240, the substrate treating apparatus 100A performs a draining treatment ("solution draining treatment") of draining off liquids such as the rinse solutions adhering to the substrate W and the lower nozzle 240 to dry the substrate W and the lower nozzle 240 (Step S50 of FIG. 26).

<2-2-6. Stop of Rotation of Substrate>

After the completion of the draining treatment, the substrate treating apparatus 100A controls the chuck rotating mechanism 156 to stop the rotation of the spin chuck 111 (Step S60 of FIG. 26), thereby ending a series of substrate treatments. In the case where a plurality of chemical solution treatments are sequentially performed on the substrate W held by the spin chuck 111, the treatments of Steps S20 to S40 may be repeated after the completion of the draining treatment of Step S40.

2-3. Influence of Temperature Rise of Lower Nozzle 240 and Measure Against Temperature Rise The substrate treating apparatus 100A can sequentially perform a plurality of chemical solution treatments on the substrate W using a plurality of treatment solutions each containing a plurality of chemical solutions. One specific example of such a chemical solution treatment is a chemical solution treatment of sequentially performing one chemical solution treatment and the other chemical solution treatment. In the one chemical solution treatment, dilute hydrofluoric acid (DHF) of 24° C. containing hydrogen fluoride (HF) and pure water mixed at a predetermined ratio is used as the treatment solution 53. In the other chemical solution treatment, ammonium hydroxide of 60° C. containing ammonium hydroxide ($NH_4OH$) and high-temperature pure water mixed at a predetermined ratio is used as the treatment solution 53.

The substrate treating apparatus 100A can sequentially perform the low-temperature chemical solution treatment using a low-temperature treatment solution 53 and the high-temperature chemical solution treatment using a high-temperature treatment solution 53 on a plurality of substrates W while changing a substrate W using a transfer arm (not shown).

In this case, first, the substrate treating apparatus 100A sequentially performs the treatments of Steps S10 to S30

(starting the rotation of the substrate, the chemical solution treatment (low-temperature chemical solution treatment), and the rinsing treatment) of the flowchart of FIG. 26 on a first substrate W using a low-temperature treatment solution 53. During the low-temperature chemical solution treatment, concurrently with the upper nozzle 120 discharging the treatment solution 53, the lower nozzle 240 discharges, for example, the liquids 51 and 52 having the same temperature as that of the low-temperature treatment solution 53 to the lower surface S2 of the substrate W to adjust the temperature distribution of the substrate W.

Then, the substrate treating apparatus 100A sequentially performs the treatments of Steps S20 and S30 (the chemical solution treatment (high-temperature chemical solution treatment) and the rinsing treatment) using a high-temperature treatment solution 53. During the high-temperature chemical solution treatment, concurrently with the upper nozzle 120 discharging the high-temperature treatment solution 53, the lower nozzle 240 discharges, for example, the liquids 51 and 52 having the same temperature as that of the high-temperature treatment solution 53 to the lower surface S2 of the substrate W to adjust the temperature distribution of the substrate W. After that, the substrate treating apparatus 100A sequentially performs the treatments of Steps S40 to S60 (the cleaning treatment for a lower nozzle, the draining treatment, and stopping the rotation of the substrate), thereby ending the treatment for the substrate W being treated. In the cleaning treatment for a lower nozzle and the draining treatment, the substrate treating apparatus 100A discharges, for example, the low-temperature liquids 51 and 52 having the same temperature as that of the low-temperature treatment solution 53 to the lower surface S2 of the substrate W from the lower nozzle 240 as a rinse solution.

The substrate treating apparatus 100A repeats a series of substrate treatments including the low-temperature chemical solution treatment and the high-temperature chemical solution treatment on a plurality of substrates W while changing a substrate W. In the high-temperature chemical solution treatment, concurrently with discharging by the high-temperature treatment solution 53, the high-temperature liquids 51 and 52 are discharged to the lower surface S2 of the substrate W from the lower nozzle 240. Consequently, the temperature of the lower nozzle 240 after the high-temperature chemical solution treatment becomes higher than after the immediately preceding low-temperature chemical solution treatment.

Discussed below is a case where in the rinsing treatment after the high-temperature chemical solution treatment in which the temperature of the lower nozzle 240 has risen as described above, the lower nozzle 240 performs, out of discharging of the liquid 51 to the central section K1 of the lower surface S2 and discharging of the liquid 52 to the intermediate section K2 and the peripheral section K3, only the discharging of the liquid 51. This is because a supply of a liquid for temperature adjustment to the edge is not necessary due to a relatively low demand for the temperature uniformity in a main surface of the substrate W in the rinsing treatment than in etching. In this case, the temperature of the lower nozzle 240 after the rinsing treatment normally does not drop to the temperature in the start of the immediately preceding low-temperature chemical solution treatment. The period of the cleaning treatment for the lower nozzle in Step S40 is normally shorter than the period of the rinsing treatment, and accordingly, even after the cleaning treatment for the lower nozzle, the temperature of the lower nozzle 240 does not drop to the temperature in the start of the immediately preceding low-temperature chemical solution treatment. For this reason, when a series of substrate treatments are repeatedly performed on a plurality of substrates W, the temperature of the lower nozzle 240 rises with an increasing number of substrates W that have been treated, and the temperatures of the liquids 51 and 52, discharged from the lower nozzle 240 during the low-temperature chemical solution treatment, rise while the liquids 51 and 52 pass through the flow paths 246 and 247 inside the lower nozzle 240. The temperature of the substrate W in the low-temperature chemical solution treatment rises with an increasing number of substrates treated, thus making it difficult to treat each portion of the substrate W with a desired treatment amount.

Thus, the substrate treating apparatus 100A discharges a low-temperature liquid 51 to the central section K1 of the lower surface S2 of the substrate W from the discharge port 241 of the lower nozzle 240 in the rinsing treatment after the high-temperature chemical solution treatment, and also discharges a low-temperature liquid 52 to the intermediate section K2 and the peripheral section K3 of the lower surface S2 from the discharge ports 242 and 243. This rinsing treatment can decrease the temperature of the lower nozzle 240, which has been increased in the high-temperature chemical solution treatment, more than in the case where only the liquid 51 out of the liquids 51 and 52 is discharged in the rinsing treatment after the high-temperature chemical solution treatment. Consequently, each portion of each substrate W can be more easily treated uniformly with a desired treatment amount if a series of substrate treatments including the low-temperature chemical solution treatment and the high-temperature chemical solution treatment are sequentially repeated on a plurality of substrates W.

Figure 19:
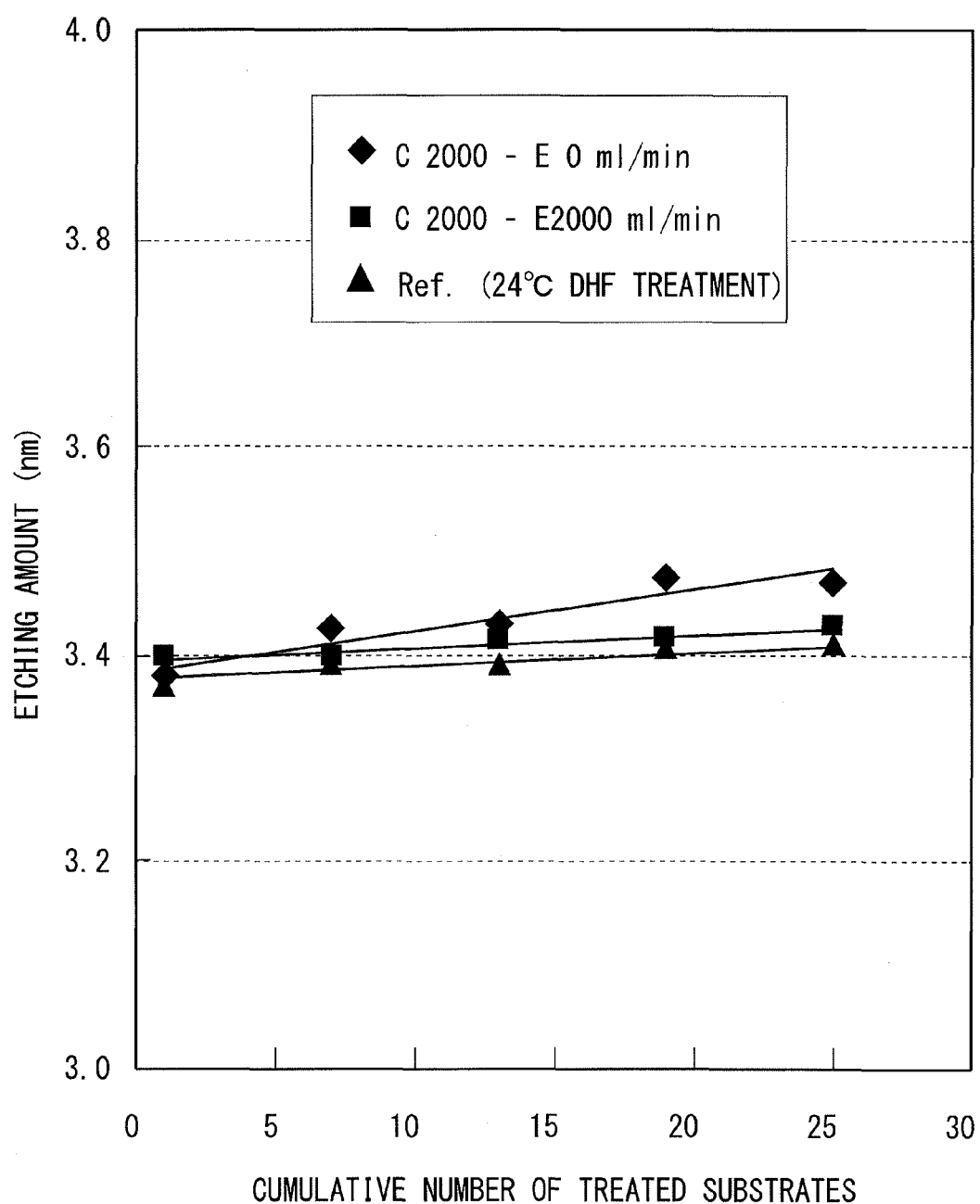
FIG. 19 graphically shows an example relationship between a cumulative number of substrates and an etching amount with respect to a plurality of flow rates of rinse solutions when substrate treatments are repeated in order.

FIG. 19 graphically shows an example relationship between an etching amount of a substrate W and a cumulative number of treated substrates W when a series of substrate treatments, including a low-temperature chemical solution treatment using an etching solution as the treatment solution 53 and a heating treatment for the substrate W, are sequentially performed on a plurality of (25) substrates W. The film to be treated, which is formed on each substrate W, is a thermal oxide (Th-Oxide) having a thickness of 100 nm or less. A series of substrate treatments perform a low-temperature chemical solution treatment, a rinsing treatment (first rinsing treatment), a heating treatment for a substrate W, a rinsing treatment (second rinsing treatment), and a draining treatment in the stated order during the rotation of the substrate W.

As the low-temperature chemical solution treatment, an etching treatment is performed in which dilute hydrofluoric acid (DHF) containing hydrogen fluoride (HF) and pure water mixed at a ratio of 1:50 and having a temperature adjusted to 24° C. is supplied to the substrate W for 30 seconds at a flow rate of 2000 ml/min. The number of revolutions of the substrate W in the low-temperature chemical solution treatment is 800 rpm. In the low-temperature chemical solution treatment, concurrently with a supply of dilute hydrofluoric acid to the substrate W, pure water (liquids 51 and 52) of 24° C. is supplied to the lower surface S2 of the substrate W from the discharge ports 241 to 243 of the lower nozzle 240 at a determined flow rate.

The first rinsing treatment discharges pure water of 24° C. to the lower surface S2 of the substrate W rotating at a rotational speed of 1200 rpm from the lower nozzle 240 for 18 seconds.

In the experiments, a high-temperature liquid 51 (specifically, pure water of 67° C.) and a high-temperature liquid 52

(specifically, pure water of 80° C.) are discharged to the lower surface S2 of the substrate W from the lower nozzle 240 for 60 seconds, with no treatment solution 53 discharged to the substrate W from the upper nozzle 120. The high-temperature liquid 51 is discharged to the central section K1 of the lower surface S2 at a flow rate of 500 ml/min, and the high-temperature liquid 52 is discharged to the intermediate section K2 and the peripheral section K3 of the lower surface S2 at a flow rate of 1900 ml/min. The number of revolutions of the substrate W is set to 500 rpm. This heating treatment also increases the temperatures of the substrate W and the lower nozzle 240, similarly to the high-temperature chemical solution treatment of discharging the high-temperature treatment solution 53 and the liquids 51 and 52 to the substrate W. Thus, when data is measured as shown in the graph of FIG. 19, the heating treatment for the substrate W is performed in place of the high-temperature chemical solution treatment.

The second rinsing treatment discharges pure water of 24° C. to the lower surface S2 of the substrate W from the lower nozzle 240 for 22.5 seconds. The number of revolutions of the substrate W in the second rinsing treatment is set to 1200 rpm. The combination of flow rates of the pure water (liquid 51 and liquid 52) to be supplied to the lower surface S2 during the second rinsing treatment is set in two ways as described below to verify an influence of the presence or absence of a discharge of the liquid 52 to the intermediate section K2 and the peripheral section K3 of the lower surface S2 on an etching amount. The relationship between a cumulative number of treated substrates W and an etching amount of the substrate W is measured for each of the two combinations of flow rates, which is graphically shown in FIG. 19 (a graph indicated by black rhombuses and a graph indicated by black squares).

In the draining treatment, the substrate W is rotated at 2500 rpm for 26.5 seconds, with no liquids 51 and 52 discharged to the lower surface S2 of the substrate W. In the case where a cumulative number of treated substrates W does not reach 25, the treated substrate W is replaced with an untreated substrate W after the draining treatment, and then, a series of substrate treatments are again performed on an untreated substrate W.

According to the graph indicated by black rhombuses of FIG. 19, in the second rinsing treatment, pure water is supplied to the central section K1 of the lower surface S2 of the substrate W from the discharge port 241 at a flow rate of 2000 ml/min, and no pure water is supplied from the discharge port 242 and the discharge port 243. According to the graph indicated by black squares, in the second rinsing treatment, pure water is supplied to the central section K1 from the discharge port 241 at a flow rate of 2000 ml/min, and pure water is supplied to the intermediate section K2 and the peripheral section K3 from the discharge ports 242 and 243, respectively, at a total flow rate of 2000 ml/min.

FIG. 19 also shows as reference data, by black triangles, the relationship of an etching amount to a cumulative number of treated substrates in the case where only the etching treatment with DHF of 24° C. is sequentially repeated without performing a heat treatment on the substrate W by the lower nozzle 240.

Based on the graph of FIG. 19, an increase in the etching amount obtained by subtracting an etching amount of a first substrate W from an etching amount of a 25-th substrate W is divided by 25 being a total number of treated substrates W, and then, an average value of an increase in the etching amount, which is obtained each time the number of treated substrates increases by one, is obtained, so that the following results are determined. According to the graph indicated by black triangles, an average incremental value of the etching amount is 0.0011, which is the smallest among the average values of the three graphs. According to the data indicated by black squares, the average value is 0.0013, which is slightly larger than in the case where a heat treatment is not performed on the substrate. Contrastingly, the average value in the graph indicated by black rhombuses is 0.0040, which is remarkably larger than those of the other two pieces of data.

These results reveal that in the second rinsing treatment after the heat treatment for a substrate, if low-temperature pure water is not discharged to the intermediate section K2 and the peripheral section K3 from the discharge ports 242 and 243, respectively, a temperature rise rate of the substrate W each time a series of substrate treatments are repeated is remarkably higher than in the case where the heat treatment for a substrate W is not performed. Meanwhile, it is revealed that in the second rinsing treatment, if pure water of 24° C. is discharged to the edge area of the substrate W from the discharge ports 242 and 243 at a total flow rate of at least 2000 ml/min, although a temperature rise rate of the substrate W, which is obtained each time a series of substrate treatments are repeated, is slightly high but a temperature rise rate is similarly regulated compared to the case where the heat treatment is not performed on a substrate W.

Figure 20:
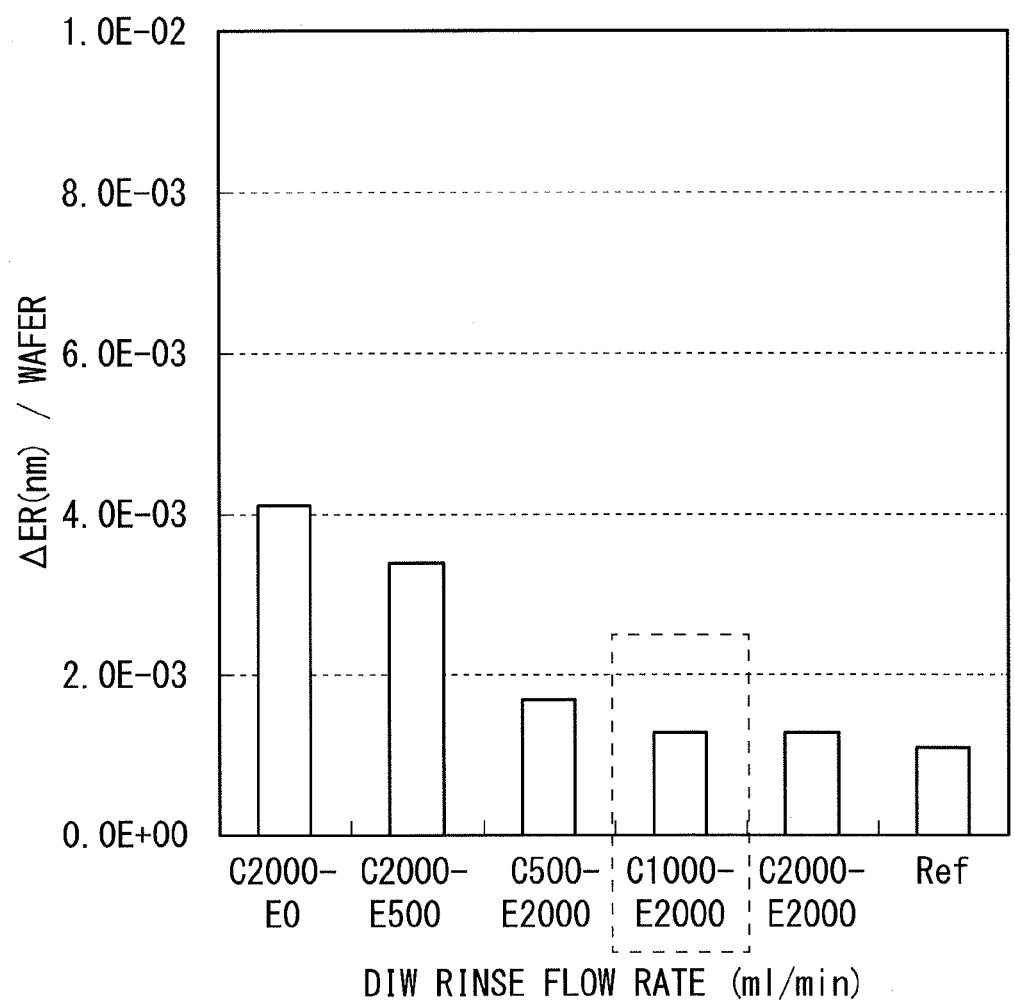
FIG. 20 graphically shows an example relationship between a flow rate of a rinse solution supplied to a lower surface of a substrate and an increasing rate of an etching amount when substrate treatments are repeated in order.

FIG. 20 graphically shows an example relationship between a flow rate of a rinse solution supplied to the lower surface S2 of the substrate W in the second rinsing treatment and an increasing rate of an etching amount (in more detail, an average incremental value of the etching amount each time the number of treated substrates increases by one) in the case where a series of substrate treatments described in the description of FIG. 19 are repeated on a plurality of substrates W while changing a substrate W.

More specifically, the graphs of FIG. 20 show the results obtained by treating 25 substrates W on the treatment conditions similar to those of the data of FIG. 19, measuring an etching amount thereof, and determining an average incremental value of the etching amount, which is obtained each time the number of treated substrates increases by one, from the measurement results. In the data measurements of the graphs of FIG. 20, combinations of a discharge flow rate of pure water from the discharge port 241 to the central section K1 and a discharge flow rate of pure water from the discharge ports 242 and 243 to the intermediate section K2 and the peripheral section K3 in the second rinsing treatment are increased more than the data measurements for the graphs of FIG. 19. For example, the description "C2000-E500" in the horizontal axis of the graphs of FIG. 20 indicates that a discharge flow rate of low-temperature pure water (liquid 51) discharged from the discharge port 241 is 2000 ml/min, and a total discharge flow rate of low-temperature pure water (liquid 52) discharged from the discharge ports 242 and 243 is 500 ml/min. The graph where the horizontal axis is "Ref" indicates, as reference data, an average incremental value of the etching amount in the case where the heating treatment by the lower nozzle 240 is not performed on the substrate W as in the graph of FIG. 19.

The results of FIG. 20 reveal that in the second rinsing treatment, in the case where pure water is discharged from the discharge port 241 at a flow rate of 2000 ml/min and also pure water is supplied from the discharge ports 242 and 243 at a flow rate of 2000 ml/min and also in the case where pure water is supplied from the discharge port 241 at a flow rate of 1000 ml/min and pure water is supplied from the discharge ports 242 and 243 at a total flow rate of 2000 ml/min (graph surrounded by a dashed line in FIG. 20), an average incremental value of the etching amount is close to the results of the reference data in which the heating treatment is not performed on the substrate W. It is therefore revealed that the conditions for supplying pure water (rinse solution) in the second rinsing treatment, indicated as C1000-E2000 in the horizontal axis of the graph of FIG. 20, are applicable to the case where a series of substrate treatments including the low-temperature chemical solution treatment and the high-temperature chemical solution treatment are repeatedly performed on a plurality of substrates W. The conditions for supplying a rinse solution are applicable as standard conditions for supplying a rinse solution in the second rinsing treatment with respect to the conditions for treating a substrate, which correspond to the graphs of FIGS. 19 and 20.

As described with reference to FIGS. 19 and 20, in the rinsing treatment after the high-temperature chemical solution treatment in the case where the substrate treating apparatus 100A performs a series of substrate treatments including the low-temperature chemical solution treatment and the high-temperature chemical solution treatment (the heating treatment for the substrate W), a supply of a low-temperature rinse solution, such as low-temperature pure water, to only the central section K1 of the lower surface S2 of the substrate W from the lower nozzle 240 may increase the temperature of the lower nozzle 240, decreasing the accuracy in controlling the temperature distribution of the substrate W by the lower nozzle 240 in the low-temperature chemical solution treatment. The substrate treating apparatus 100A thus not only discharges a low-temperature rinse solution to the central section K1 but also discharges a low-temperature rinse solution to the edge area (the intermediate section K2 and the peripheral section K3) of the lower surface S2 other than the central section K1 in the rinsing treatment for the lower surface S2, thereby cooling the lower nozzle 240 while performing the rinsing treatment for the lower surface S2 of the substrate W. In the rinsing treatment, the substrate treating apparatus 100A sets the flow rate of the liquid 51 as a rinse solution to be supplied to the central section K1 by the lower nozzle 240 to, for example, 1000 ml/min through control by the flow rate control unit 163A, and also sets the flow rate of the liquid 52 as a rinse solution to be supplied to the edge area by the lower nozzle 240 to, for example, 2000 ml/min. This sufficiently cools the lower nozzle 240, controlling the temperature distribution of the substrate W by discharging of the liquids 51 and 52 to the lower surface S2 with high accuracy. Thus, an etching amount of a substrate W can be easily controlled to a desired value in the case where the substrate treatments including the low-temperature chemical solution treatment and the high-temperature chemical solution treatment are performed on each substrate with a substrate to be treated being changed and also in the case where the low-temperature chemical solution treatment and the high-temperature chemical solution treatment are repeated on the same substrate. The flow rate of a rinse solution to be supplied to the upper surface S1 is set to, for example, 2000 ml/min. The substrate treating apparatus 100A also cools the lower nozzle 240 during the rinsing treatment, increasing the number of substrates treated per unit time.

2-4. Structure of Lower Nozzle and Airflow Around Lower Nozzle

Figure 21:
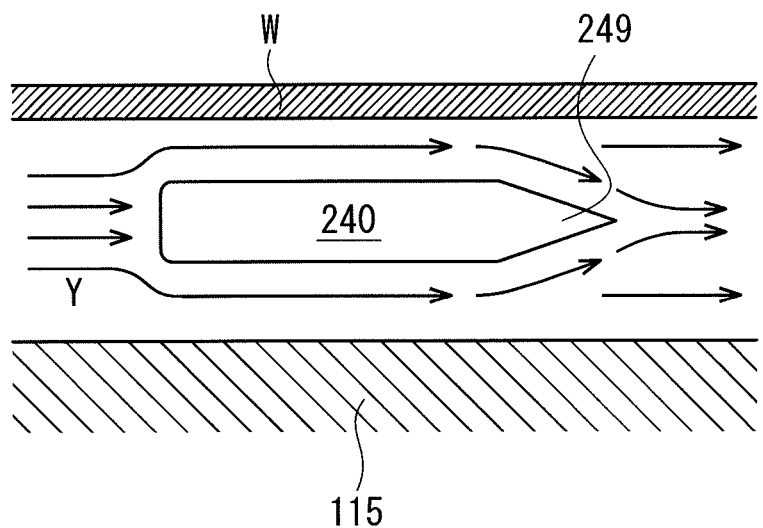
FIG. 21 is a cross-sectional view showing an airflow around the lower nozzle of FIG. 1.
Figure 22:
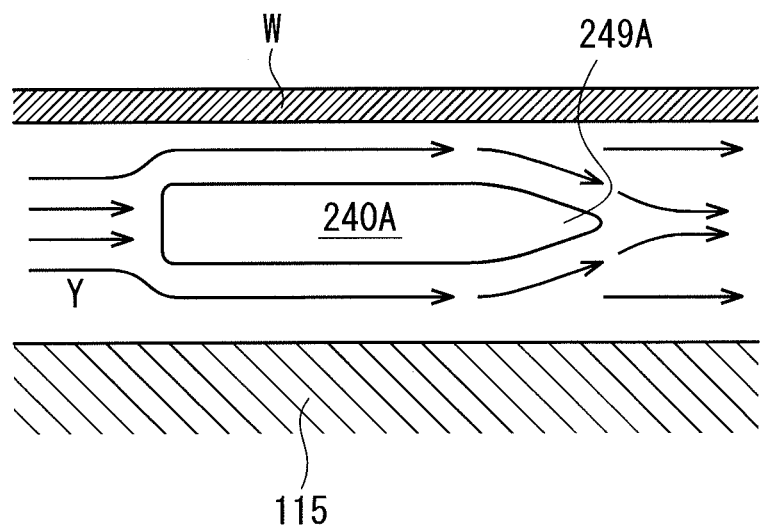
FIG. 22 is a cross-sectional view showing an airflow around a lower nozzle according to another embodiment of the present invention.
Figure 23:
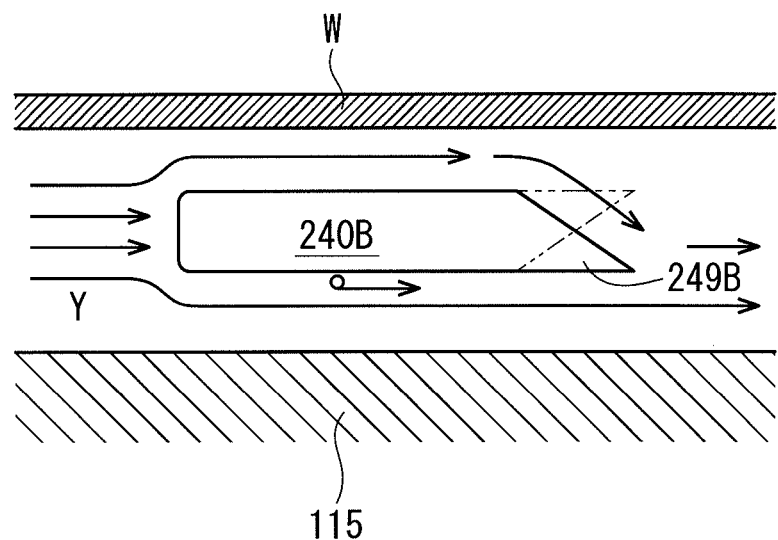
FIG. 23 is a cross-sectional view showing an airflow around a lower nozzle according to another embodiment of the present invention.
Figure 24:
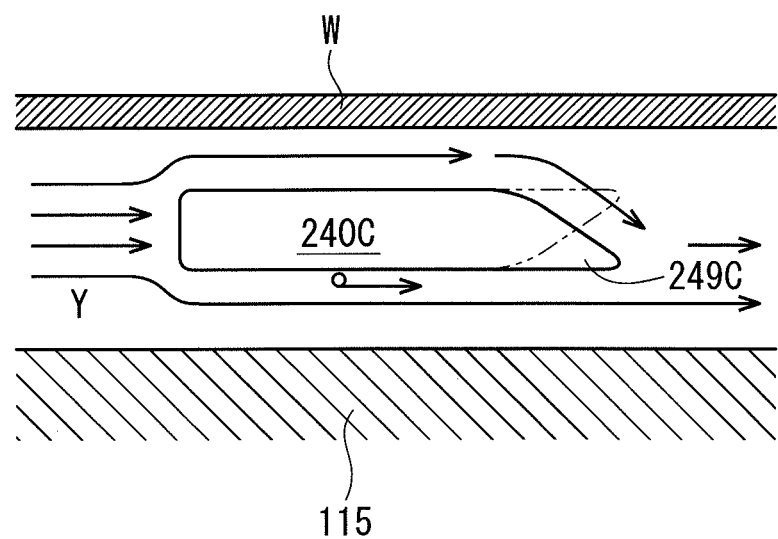
FIG. 24 is a cross-sectional view showing an airflow around a lower nozzle according to another embodiment of the present invention.
Figure 25:
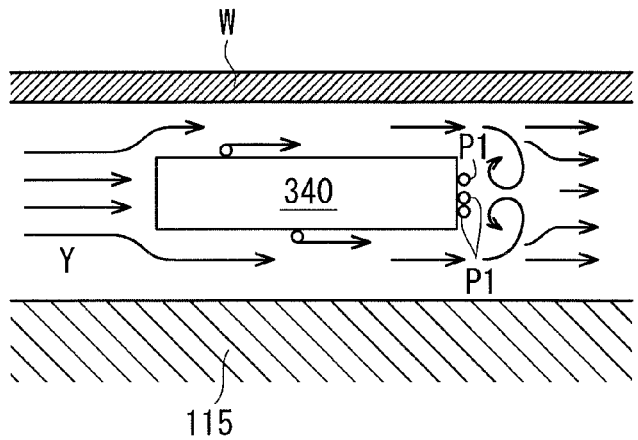
FIG. 25 is a cross-sectional view showing an airflow around a lower nozzle according to a comparative technique.

FIG. 21 is a cross-sectional view showing the structure of the lower nozzle 240 of the substrate treating apparatus 100A and an airflow therearound. FIGS. 22 to 24 are cross-sectional views showing the structures of lower nozzles 240A to 240C according to other embodiments of the lower nozzle 240 and airflows therearound. FIG. 25 is a cross-sectional view showing the structure of a lower nozzle 340 according to a comparative technique and an airflow therearound. In FIGS. 21 to 25, the direction of rotation of the substrate W is from the left to the right of the sheet.

As shown in FIGS. 1 to 3, the lower nozzle 240 is extended, between the lower surface S2 of the substrate W and the spin chuck 111, from below the central portion of the substrate W to below the edge portion of the substrate W while having a flat rod shape with a small thickness perpendicular to the lower surface S2.

As shown in FIG. 21, the lower nozzle 240 includes a downstream end in the direction of rotation of the substrate W, an upstream end in the direction of rotation, and a central portion that includes a horizontal upper surface and a horizontal lower surface and is connected with each of the downstream end and the upstream end.

An airflow generated through the rotation of the substrate flows in the direction indicated by the arrow Y around the lower nozzle 240 provided between the lower surface of the substrate W and the upper surface of the spin base 115.

The lower nozzles 240 and 240A to 240C according to the embodiments include draining parts 249 and 249A to 249C, respectively, at the end downstream in the airflow (downstream in the direction of rotation of the substrate W). The draining parts 249 and 249A to 249C become thinner as they are located more downstream in the direction of rotation with a slope gradient gentler than those of the upstream ends of the lower nozzles 240 and 240A to 240C. The draining parts 249 and 249A have slope gradients on the upper and lower surfaces thereof, whereas the draining parts 249B and 249C have a slope gradient only on their upper surfaces, with their lower surfaces being horizontal. The draining parts 249B and 249C may have a slope gradient on their lower surfaces, with their upper surfaces being horizontal.

Each of the draining parts 249 and 249B has a sharpened tip downstream in the direction of rotation of the substrate W. This further reduces the generation of an eddy at the tip. Even a round tip can prevent or reduce the adhesion of water droplets, which does not diminish the utility of the draining part.

The angle between the upper surface and the lower surface of the draining part 249 is an acute angle. This causes an airflow to flow more easily along the surface of the draining part 249. If a rounded portion connecting the horizontal surface and the sloping surface of the draining part is round, as in the sloping surface of the draining part 249A and a rounded portion connecting the horizontal surface and the sloping surface of the draining part 249C, airflows flowing along the surfaces of the draining parts become more smooth, further preventing or reducing the adhesion of water droplets to the lower nozzle. The sloping surfaces of the upper surfaces and the lower surfaces of the draining parts 249 and 249A to 249C are formed in a planar shape, which may be formed as curved surfaces projecting upward or downward.

The upper and lower surfaces of the lower nozzle 340 according to the comparative technique shown in FIG. 25 are horizontal surfaces. The lateral surface of the lower nozzle 340 upstream in the direction of rotation and the lateral surface thereof downstream in the direction of rotation of the substrate W are provided such that their normals coincide with the direction of rotation of the substrate W in the lower nozzle 340. Also when a liquid adheres to the lateral surface upstream in the lower nozzle 340, due to a strong impact of the airflow, the adhering liquid is blown off in the downstream direction of the airflow to be removed from the lower nozzle 340. However, the lateral surface of the lower nozzle 340 downstream in the direction of rotation of the substrate W perpendicularly crosses the upper surface and the lower surface, making it difficult for the airflows flowing along the upper surface and the lower surface to flow along the downstream lateral surface. Thus, many water droplets P1 remain on the downstream lateral surface while adhering thereto, triggering a watermark or particle in, for example, the treatment for a new substrate. Depending on the airflow rate, more water droplets P1 tend to remain due to the generation of an eddy on the downstream side.

In the substrate treating apparatus according to the second embodiment configured as described above, the draining part 249 provided at the end of the lower nozzle 240 downstream in the direction of rotation of the substrate W becomes thinner from the end upstream in the direction of rotation to the end downstream in the direction of rotation with a gentle slope gradient. Thus, the airflow formed through the rotation of the substrate W more easily flows along the surface of the draining part 249 after flowing along the upper surface and the lower surface of the lower nozzle 240, preventing or reducing a liquid remaining on the surface of the lower nozzle 240 after the draining treatment.

In the substrate treating apparatus according to the second embodiment configured as described above, the angle between the upper surface and the lower surface of the draining part 249 is an acute angle, causing an airflow formed through the rotation of the substrate W to more easily flow along the surface of the draining part 249. This further prevents or reduces a liquid remaining on the surface of the lower nozzle 240 after the draining treatment.

The substrate treating apparatus according to the second embodiment configured as described above has a pointed tip of the draining part 249 downstream in the direction of rotation of the substrate W, preventing or reducing the formation of an eddy at the tip of the draining part 249 by the airflow formed through the rotation of the substrate W. Thus, a liquid remaining after the draining treatment can be prevented or reduced also at the tip of the draining part 249.

In the method of treating a substrate by the substrate treating apparatus according to the second embodiment, the liquid 52 (rinse solution) is discharged at a second flow rate to the edge area (the intermediate section K2 and the peripheral section K3) of the lower surface S2 from the discharge ports 242 and 243 with the liquid 51 (rinse solution) being discharged at a first flow rate to the central section K1 of the lower surface S2 of the substrate W from the discharge port 241 of the lower nozzle 240. The liquid 51 discharged to the lower surface S2 of the substrate W from the lower nozzle 240 spreads along the lower surface S2, and then falls from the lower surface S2 to be supplied to the lower nozzle 240. The liquid 51 discharged to the lower surface S2 spreads farther along the lower surface S2 with a higher flow rate. Although the discharge ports 242 and 243 are farther from the one-side portion 271 of the lower nozzle 240 than the discharge port 241, the second flow rate is higher than the first flow rate. Thus, even if the flow rates thereof are increased sufficiently, both of the liquid 51, which is discharged from the discharge port 241 and spreads along the lower surface S2 of the substrate W, and the liquid 52, which is discharged from the discharge ports 242 and 243 and spreads along the lower surface S2 of the substrate W, collide with each other in the portion of the lower surface S2 of the substrate W, which is above or near the one-side portion 271 of the lower nozzle 240, and then fall together to the lower nozzle. This allows much of the liquids 51 and 52 to be supplied to the one-side portion 271. Therefore, the chemical solution remaining in the one-side portion 271 can be sufficiently replaced with the liquids 51 and 52 to clean the one-side portion 271, preventing or reducing the chemical solution remaining in the one-side portion 271.

In the method of treating a substrate by the substrate treating apparatus according to the second embodiment described above, the second flow rate is a flow rate at which the liquid 52 discharged to the edge area (the intermediate section K2 and the peripheral section K3) of the lower surface S2 from the discharge ports 242 and 243 of the lower nozzle 240 can be supplied to the one-side portion 271 through the edge area. This allows more liquid 52 to be supplied to the one-side portion 271 from the discharge ports 242 and 243, further preventing or reducing a chemical solution remaining in the one-side portion 271.

In the method of treating a substrate by the substrate treating apparatus according to the second embodiment described above, the substrate W is rotated at a first rotational speed while being subjected to the chemical solution treatment and is also rotated at a second rotational speed lower than the first rotational speed while being subjected to the cleaning treatment for the lower nozzle 240. This allows more liquid 52 to reach the one-side portion 271 of the lower nozzle 240 from the discharge ports 242 and 243 through the intermediate section K2 and the peripheral section K3, further reducing a chemical solution remaining in the one-side portion 271.

In the method of treating a substrate by the substrate treating apparatus according to the second embodiment described above, the space V between the horizontal surface of the lower nozzle 240 and the lower surface S2 of the substrate W is liquid-tight, that is, is filled with the liquid containing the liquids 51 and 52 discharged from the lower nozzle 240. This reduces the portions of the horizontal surface of the lower nozzle 240, which are not supplied with the liquids 51 and 52, can be reduced, further preventing or reducing a chemical solution remaining in the one-side portion 271 of the lower nozzle 240.

In the method of treating a substrate by the substrate treating apparatus according to the second embodiment described above, the chemical solution adhering to the one-side portion 271 of the lower nozzle 240 is also drained from the drain hole 253*a* provided in the one-side portion 271 to the outside of the lower nozzle 240 together with the liquids 51 and 52 supplied to the one-side portion 271, further preventing or reducing a chemical solution remaining in the one-side portion 271.

In the method of treating a substrate by the substrate treating apparatus according to the second embodiment described above, the counterbore 253 is provided in the one-side portion 271 of the lower nozzle 240, and the drain hole 253*a* is provided in the bottom of the counterbore 253. The chemical solution remaining in the counterbore 253 is drained from the drain hole 253*a* to the outside of the lower nozzle 240 together with the liquids 51 and 52. This further prevents or reduces a chemical solution remaining in the one-side portion 271.

While the invention has been described in detail, the foregoing description is in all aspects illustrative and not restrictive. It is understood that numerous other modifications and variations can be devised without departing from the scope of the invention.

What is claimed is:

1. A substrate treating apparatus, comprising:
a rotating and holding unit that rotates a substrate while horizontally holding the substrate;
a first supply source that supplies first pure water having a first temperature;
a second supply source that supplies second pure water having a second temperature higher than the first temperature;
a pipe system that guides said first pure water by dividing said first pure water into one first pure water and the other first pure water;
a treatment solution supply unit that is supplied with said one first pure water from said pipe system and supplies a treatment solution to a central section of an upper surface of said substrate, said treatment solution containing said one first pure water and a chemical solution mixed so as to mainly contain said one first pure water;
a first supply unit that is supplied with said other first pure water from said pipe system and supplies a first liquid mainly containing said other first pure water to a central section of a lower surface of said substrate;
a second supply unit that supplies a second liquid mainly containing said second pure water supplied from said second supply source to a peripheral section of the lower surface of said substrate and to an intermediate section of the lower surface between said peripheral section and said central section; and
a heat amount control unit that independently controls an amount of heat to be supplied to said substrate by said first supply unit and an amount of heat to be supplied to said substrate by said second supply unit such that a temperature distribution in a radial direction of said substrate is changeable.

2. The substrate treating apparatus according to claim 1, wherein said pipe system has one end connected to said first supply source and is branched off at some midpoint in a conduit.

3. The substrate treating apparatus according to claim 1, wherein said first supply unit mixes said other first pure water and a liquid for temperature adjustment having the same temperature as that of said chemical solution such that a mixing ratio between said one first pure water and said chemical solution in said treatment solution is equal to a mixing ratio between said other first pure water and said liquid for temperature adjustment in said first liquid, to thereby prepare said first liquid.

4. The substrate treating apparatus according to claim 1, further comprising
a scanning unit that causes a nozzle of said treatment solution supply unit supplying said treatment solution to the upper surface of said substrate to perform scanning above the upper surface of said substrate, to thereby scan a supply position of said treatment solution on the upper surface of said substrate between the central section and the peripheral section of the upper surface of said substrate,
wherein said heat amount control unit varies, in accordance with a position of the nozzle of said treatment solution supply unit that is scanned by said scanning unit, a ratio between an amount of heat to be supplied to said substrate by said first supply unit and an amount of heat to be supplied to said substrate by said second supply unit.

5. The substrate treating apparatus according to claim 4, wherein said heat amount control unit varies a ratio between a flow rate of said first liquid to be supplied by said first supply unit and a flow rate of said second liquid to be supplied by said second supply unit in accordance with a position of the nozzle of said treatment solution supply unit that is scanned by said scanning unit.

6. A method of treating a substrate, comprising:
a rotating and holding step of rotating a substrate while horizontally holding the substrate;
a dividing step of guiding, from a supply source that supplies first pure water having a first temperature, said first pure water by dividing said first pure water to one first pure water and the other first pure water;
a treatment solution supplying step of supplying a treatment solution to a central section of an upper surface of said substrate concurrently with said rotating and holding step, said treatment solution containing said one first pure water and a chemical solution mixed so as to mainly contain said one first pure water;
a first supplying step of supplying a first liquid mainly containing said other first pure water to a central section of a lower surface of said substrate concurrently with said treatment solution supplying step;
a second supplying step of supplying a second liquid mainly containing second pure water having a second temperature higher than said first temperature to a peripheral section of the lower surface of said substrate and to an intermediate section of the lower surface between said peripheral section and the central section concurrently with said treatment solution supplying step and said first supplying step; and
a heat amount controlling step of independently controlling an amount of heat to be supplied to said substrate in said first supplying step and an amount of heat to be supplied to said substrate in said second supplying step such that a temperature distribution in a radial direction of said substrate is changeable.

7. The method of treating a substrate according to claim 6,
wherein said dividing step divides said first pure water into said one first pure water and said other first pure water at some midpoint in a path guiding said first pure water from said supply source.

8. The method of treating a substrate according to claim 6,
wherein said first supplying step includes a preparing step of mixing said other first pure water and a liquid for temperature adjustment having the same temperature as that of said chemical solution such that a mixing ratio between said one first pure water and said chemical solution in said treatment solution is equal to a mixing ratio between said other first pure water and said liquid for temperature adjustment in said first liquid, to thereby prepare said first liquid.

9. The method of treating a substrate according to claim 6, further comprising
a scan step of scanning, between the central section and the peripheral section of the upper surface of said substrate, a supply position of said treatment solution supplied to the upper surface of said substrate in said treatment solution supplying step,
wherein said heat amount controlling step varies, in accordance with the supply position of said treatment solution that is scanned in said scan step, a ratio between an amount of heat to be supplied to said substrate in said first supplying step and an amount of heat to be supplied to said substrate in said second supplying step.

10. The method of treating a substrate according to claim 9, wherein said heat amount control step varies a ratio between a flow rate of said first liquid to be supplied in said first supplying step and a flow rate of said second liquid to be supplied in said second supplying step in accordance with the supply position of said treatment solution that is scanned in said scan step.

11. The substrate treating apparatus according to claim 1, further comprising:
a lower nozzle that is extended, between the lower surface of said substrate and said rotating and holding unit, from below the central portion of said substrate to below the edge portion of said substrate while having a flat rod shape with a small thickness in a direction perpendicular to the lower surface of said substrate, said lower nozzle discharging said liquid to the lower surface of said substrate,
said lower nozzle including:
a downstream end in a direction of rotation of said substrate;
an upstream end in the direction of rotation; and
a central portion having a horizontal upper surface and a horizontal lower surface and being connected to said downstream end and said upstream end;
wherein said downstream end of said lower nozzle is provided with a thin wall portion that becomes thinner as being located more downstream in the direction of rotation with a slope gradient gentler than that of said upstream end.

12. The substrate treating apparatus according to claim 11, wherein an angle between the upper surface and the lower surface of said thin wall portion is an acute angle.

13. The substrate treating apparatus according to claim 11, wherein a tip of said thin wall portion downstream in the direction of rotation of said substrate is pointed.

* * * * *